United States Patent
Porter et al.

(10) Patent No.: US 10,909,757 B2
(45) Date of Patent: Feb. 2, 2021

(54) COMPUTER VISION SYSTEMS AND METHODS FOR MODELING ROOFS OF STRUCTURES USING TWO-DIMENSIONAL AND PARTIAL THREE-DIMENSIONAL DATA

(71) Applicant: Geomni, Inc., Jersey City, NJ (US)

(72) Inventors: Bryce Zachary Porter, Lehi, UT (US); Ryan Mark Justus, Lehi, UT (US)

(73) Assignee: Geomni, Inc., Jersey City, NJ (US)

( * ) Notice: Subject to any disclaimer, the term of this patent is extended or adjusted under 35 U.S.C. 154(b) by 0 days.

(21) Appl. No.: 16/443,125

(22) Filed: Jun. 17, 2019

(65) Prior Publication Data

US 2019/0385363 A1    Dec. 19, 2019

Related U.S. Application Data

(60) Provisional application No. 62/685,415, filed on Jun. 15, 2018.

(51) Int. Cl.
```
G06T 17/10      (2006.01)
G06T 15/10      (2011.01)
G06N 3/08       (2006.01)
G06F 30/13      (2020.01)
```
(52) U.S. Cl.
CPC .............. G06T 17/10 (2013.01); G06F 30/13 (2020.01); G06N 3/08 (2013.01); G06T 15/10 (2013.01)

(58) Field of Classification Search
None
See application file for complete search history.

(56) References Cited

U.S. PATENT DOCUMENTS

| | | |
|---|---|---|
| 5,671,343 A | 9/1997 | Kondo et al. |
| 8,078,436 B2 | 12/2011 | Pershing et al. |
| 8,131,514 B2 | 3/2012 | Royan et al. |
| 8,170,840 B2 | 5/2012 | Pershing |

(Continued)

FOREIGN PATENT DOCUMENTS

| | | |
|---|---|---|
| EP | 1010966 A1 | 6/2000 |
| WO | 2017/124116 A1 | 7/2017 |

OTHER PUBLICATIONS

International Search Report of the International Searching Authority dated Sep. 4, 2019, issued in connection with International Application No. PCT/US19/37472 (3 pages).

(Continued)

Primary Examiner — Michelle Chin
(74) Attorney, Agent, or Firm — McCarter & English, LLP

(57) ABSTRACT

A system for modeling a roof of a structure comprising a first database, a second database and a processor in communication with the first database and the second database. The processor selects one or more images and the respective metadata thereof from the first database based on a received a geospatial region of interest. The processor generates two-dimensional line segment geometries in pixel space based on two-dimensional outputs generated by a neural network in pixel space of at least one roof structure present in the selected one or more images. The processor classifies the generated two-dimensional line segment geometries into at least one contour graph based on three-dimensional data received from the second database and generates a three-dimensional representation of the at least one roof structure based on the at least one contour graph and the received three-dimensional data.

17 Claims, 24 Drawing Sheets

(56) References Cited

U.S. PATENT DOCUMENTS

| | | | |
|---|---|---|---|
| 8,209,152 | B2 | 6/2012 | Pershing |
| 8,417,061 | B2 | 4/2013 | Kennedy et al. |
| 8,422,825 | B1 | 4/2013 | Neophytou et al. |
| 8,731,234 | B1 | 5/2014 | Ciarcia et al. |
| 8,818,770 | B2 | 8/2014 | Pershing |
| 8,825,454 | B2 | 9/2014 | Pershing |
| 9,129,376 | B2 | 9/2015 | Pershing |
| 9,135,737 | B2 | 9/2015 | Pershing |
| 9,501,700 | B2 | 11/2016 | Loveland et al. |
| 9,679,227 | B2 | 6/2017 | Taylor et al. |
| 10,127,670 | B2 | 11/2018 | Lewis et al. |
| 2011/0033110 | A1 | 2/2011 | Shimamura et al. |
| 2013/0211790 | A1 | 8/2013 | Loveland et al. |
| 2013/0300740 | A1 | 11/2013 | Snyder et al. |
| 2017/0316115 | A1 | 11/2017 | Lewis et al. |
| 2018/0089833 | A1 | 3/2018 | Lewis et al. |
| 2018/0122137 | A1 | 5/2018 | Tian et al. |
| 2019/0102897 | A1 | 4/2019 | Lewis et al. |

OTHER PUBLICATIONS

Written Opinion of the International Searching Authority dated Sep. 4, 2019, issued in connection with International Application No. PCT/US19/37472 (5 pages).

International Search Report of the International Searching Authority dated Jun. 11, 2018, issued in connection with International Application No. PCT/US17/53631 (4 pages).

Written Opinion of the International Searching Authority dated Jun. 11, 2018, issued in connection with International Application No. PCT/US17/53631 (4 pages).

Aichholzer et al., "A Novel Type of Skeleton for Polygons", Journal of Universal Computer Science, vol. 1, No. 12, 1995, pp. 752-761 (10 pages).

APPLICAD, "Product Bulletin—Nov. 2002: Key Features of our Roofing Software", Nov. 2002 (46 pages).

Avrahami et al., "Extraction of 3D Spatial Polygons Based on the Overlapping Criterion for Roof Extraction from Aerial Images", CMRT05, International Archives of Photogrammetry, Remote Sensing and Spatial Information Sciences, vol. 36, part 3, Aug. 2005 (6 pages).

Biedl et al., "Weighted Straight Skeletons in the Plane", Computational Geometry, vol. 48, No. 2, 2015, pp. 120-133 (28 pages) (retrieved from https://www.ncbi.nlm.nih.gov/pmc/articles/PMC4235777/).

Felkel et al., "Straight Skeleton Implementation", Proceedings of Spring Conference on Computer Graphics, Budmerice, Slovakia, 1998, pp. 210-218 (10 pages).

Hsieh, "Design and Evaluation of a Semi-Automated Site Modeling System", Carnegie Mellon University, School of Computer Science, Nov. 1995 (83 pages).

Kelly, "Unwritten Procedural Modeling with the Straight Skeleton", Doctoral dissertation, University of Glasgow, 2014 (258 pages, submitted in two parts).

Labe et al., "Robust Techniques for Estimating Parameters of 3D Building Primitives", International Archives of Photogrammetry and Remote Sensing, vol. 32, part 2, Proceedings of the Commission II Symposium on Data Integration: Systems andTechniques, Jul. 1998, pp. 169-176 (11 pages).

Long et al., "Fully Convolutional Networks for Semantic Segmentation", Proceedings of the IEEE Conference on Computer Vision and Pattern Recognition, 2015, pp. 3431-3440 (10 pages).

McKeown et al., "Automatic Cartographic Feature Extraction Using Photogrammetric Principles", Digital Photogrammetry: an Addendum to the Manual of Photogrammetry, Chapter 9: Feature Extraction and Object Recognition, American Society forPhotogrammetry and Remote Sensing, 1996, pp. 195-211 (28 pages).

Noronha et al., "Detection and Modeling of Buildings from Multiple Aerial Images," IEEE Transactions on Pattern Analysis and Machine Intelligence, vol. 23, No. 5, May 2001, pp. 501-518 (32 pages).

von Gioi et al., "LSD: a Line Segment Detector", Image Processing on Line, vol. 2, 2012, pp. 35-55 (21 pages).

Xie et al., "Holistically-Nested Edge Detection", Proceedings of the IEEE International Conference on Computer Vision, 2015, pp. 1395-1403 (9 pages).

European Search Report dated Aug. 14, 2019, issued by the European Patent Office in connection with European Patent Application No. 17886999.6 (11 pages).

Shao, et al., "Automatic Building Outline Reconstruction Using 2D Building Data and Stereo Images," Asian Conference on Remote Sensing, Nov. 25, 2002 (7 pages).

Henricsson, "The Role of Color Attributes and Similarity Grouping in 3-D Building Reconstruction," Computer Vision and Image Understanding, Academic Press, vol. 72, No. 2, Nov. 1998 (22 pages).

Rafael Grompone von Gioi, et al., "LSD: A Line Segment Detector," Image Processing on Line, Mar. 24, 2012 (10 pages).

Laycock, et al., "Automatically Generating Roof Models from Building Footprints," WSCG Posters Proceedings, Feb. 3, 2003 (4 pages).

COMPUTER VISION SYSTEMS AND METHODS FOR MODELING ROOFS OF STRUCTURES USING TWO-DIMENSIONAL AND PARTIAL THREE-DIMENSIONAL DATA

RELATED APPLICATIONS

This application claims priority to U.S. Provisional Application Ser. No. 62/685,415 filed on Jun. 15, 2018, the entire disclosure of which is hereby expressly incorporated by reference.

BACKGROUND

Technical Field

The present disclosure relates generally to the field of computer modeling of structures and property. More specifically, the present disclosure relates to systems and methods for reconstructing a three dimensional ("3D") structure in world coordinates from one or more two dimensional ("2D") images.

Related Art

Accurate and rapid identification and depiction of objects from digital images (e.g., aerial images, satellite images, ground-based images, etc.) is increasingly important for a variety of applications. For example, information related to the roofs of buildings is often used by construction professionals to specify materials and associated costs for both newly-constructed buildings, as well as for replacing and upgrading existing structures. Further, in the insurance industry, accurate information about structures may be used to determine the proper costs for insuring buildings/structures. Still further, government entities can use information about the known objects in a specified area for planning projects such as zoning, construction, parks and recreation, housing projects, etc.

Various software systems have been implemented to process aerial images to identify a set of 2D segments and generate a 3D model of a structure. However, these systems may have drawbacks, such as an inability to accurately depict elevation or detect internal line segments. This may result in an inaccurate or an incomplete 3D model of the structure. As such, the ability to generate an accurate and complete 3D model from 2D images is a powerful tool. Accordingly, the computer vision systems and methods disclosed herein solve these and other needs by providing robust line extraction, line graph construction, and 3D reconstruction methods using two-dimensional, as well as partial three-dimensional, data.

SUMMARY

This present disclosure relates to systems and methods for modeling roofs of structures using two-dimensional and partial three-dimensional data. The two dimension sources can be image sources which include, but are not limited to, aerial imagery, satellite imagery, ground-based imagery, imagery taken from unmanned aerial vehicles (UAVs), mobile device imagery, etc. The three-dimensional data can include, but is not limited to, light detection and ranging ("LIDAR"), point cloud, feature triangulation, etc. The disclosed system can retrieve one or more images and metadata for the one or more images based on a geospatial region of interest. The system can then generate 2D outputs in pixel space from the image(s). The system can then create 2D line segment geometries in pixels space from the 2D outputs. Next, the system can construct a line segment graph from the 2D line segment geometries along with raw 3D information. Finally, the system can generate 3D line segment geometries in world space from the line graph and image metadata.

BRIEF DESCRIPTION OF THE DRAWINGS

The foregoing features of the invention will be apparent from the following Detailed Description of the Invention, taken in connection with the accompanying drawings, in which.

DETAILED DESCRIPTION

The present disclosure relates to computer modeling systems and methods for modeling roofs of structures using two-dimensional and partial three-dimensional data as described in detail below in connection with FIGS. 1-23.

The embodiments below will be related to reconstructing a 3D roof geometry in world coordinates and will refer to a roof of a structure in one or more images. It should be understood that any reference to the roof of the structure is only by way of example and that the systems, methods and embodiments discussed throughout this disclosure may be applied to any structure, including but not limited to, roofs, walls, buildings, awnings, houses, decks, pools, temporary structures such as tents, motor vehicles, foundations, etc.

Figure 1:
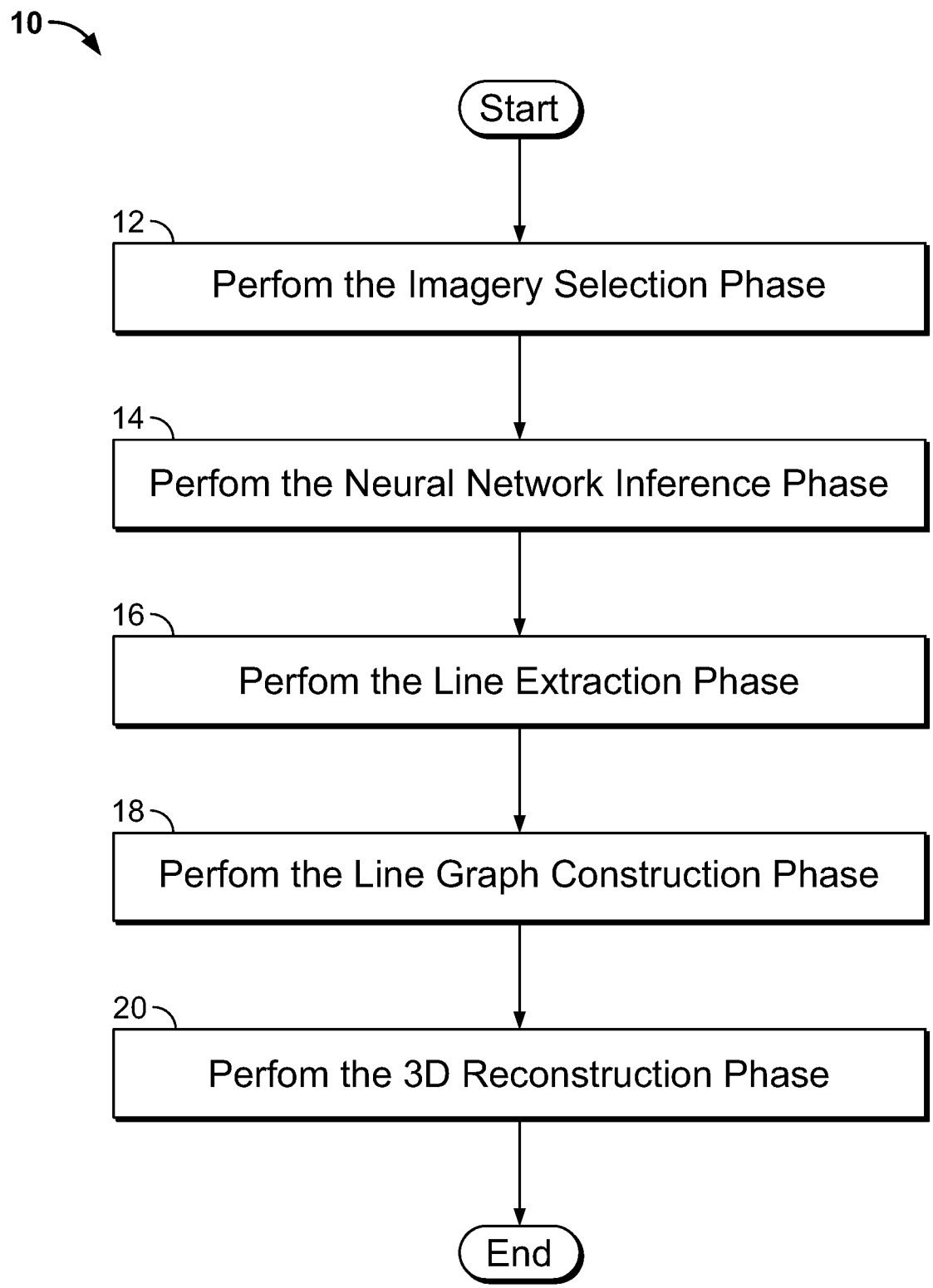
FIG. 1 is a flowchart illustrating overall process steps carried out by the system of the present disclosure.
Figure 2:
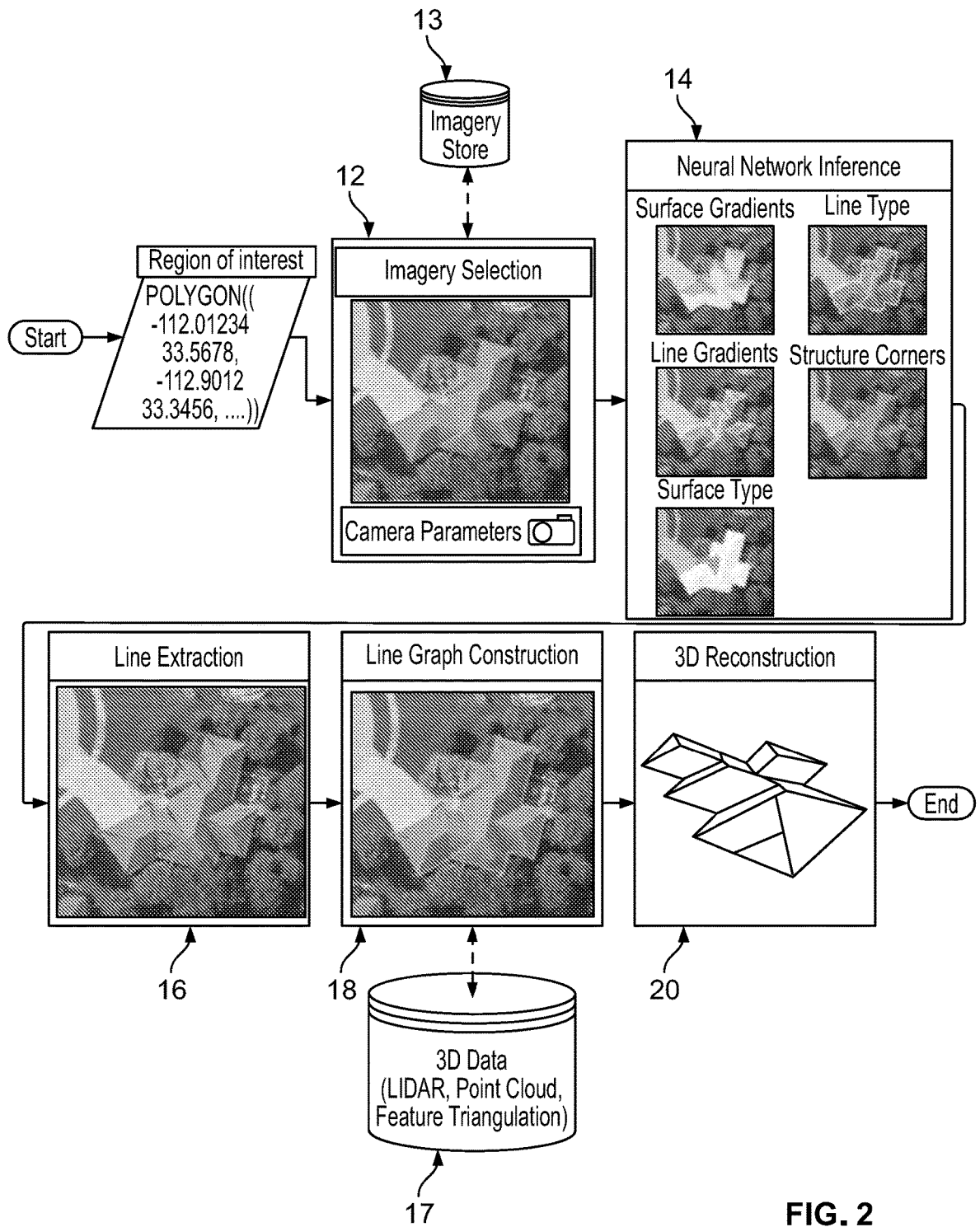
FIG. 2 is a diagram illustrating the overall process steps of FIG. 1 in greater detail.

FIG. 1 shows a flowchart illustrating the overall process steps being carried out by the system, indicated generally at method 10. In step 12, the system 10 performs an imagery selection phase. The imagery selection phase retrieves one or more images and metadata of the retrieved images based on a geospatial region of interest ("ROI"). In step 14, the system 10 performs a neural network inference phase. The neural network inference phase produces 2D outputs in pixel space, such as surface gradients, line gradients, line types, corners, etc., for one or more structures in the retrieved image(s). In step 16, the system 10 performs a line extraction selection phase. The line extraction phase processes the neural network inference outputs to create 2D line segment geometries in the pixel space. In step 18, the system 10 performs a line graph construction phase. The line graph construction phase processes the 2D line segment geometries along with raw 3D information to group segments into directed contour graphs of various heights. In step 20, the system 10 performs a 3D reconstruction phase. The 3D reconstruction phase processes the output from the line graph construction phase and the metadata from the image(s) to transform the line data into 3D line segment geometries in world space. Each step of FIG. 1 will be described in greater detail below. FIG. 2 illustrates the method 10. As shown in FIG. 2, the image selection phase 12 can also receive data from an imagery storage 13 and the line graph construction phase 18 can also receive 3D data from a 3D data storage 17.

It should be understood that FIG. 1 is only one potential configuration, and the system of the present disclosure can be implemented using a number of different configurations. The process steps of the invention disclosed herein could be embodied as computer-readable software code executed by one or more computer systems, and could be programmed using any suitable programming languages including, but not limited to, C, C++, C#, Java, Python or any other suitable language. Additionally, the computer system(s) on which the present disclosure may be embodied includes, but is not limited to, one or more personal computers, servers, mobile devices, cloud-based computing platforms, etc., each having one or more suitably powerful microprocessors and associated operating system(s) such as Linux, UNIX, Microsoft Windows, MacOS, etc. Still further, the invention could be embodied as a customized hardware component such as a field-programmable gate array ("FPGA"), application-specific integrated circuit ("ASIC"), embedded system, or other customized hardware component without departing from the spirit or scope of the present disclosure.

Figure 3:
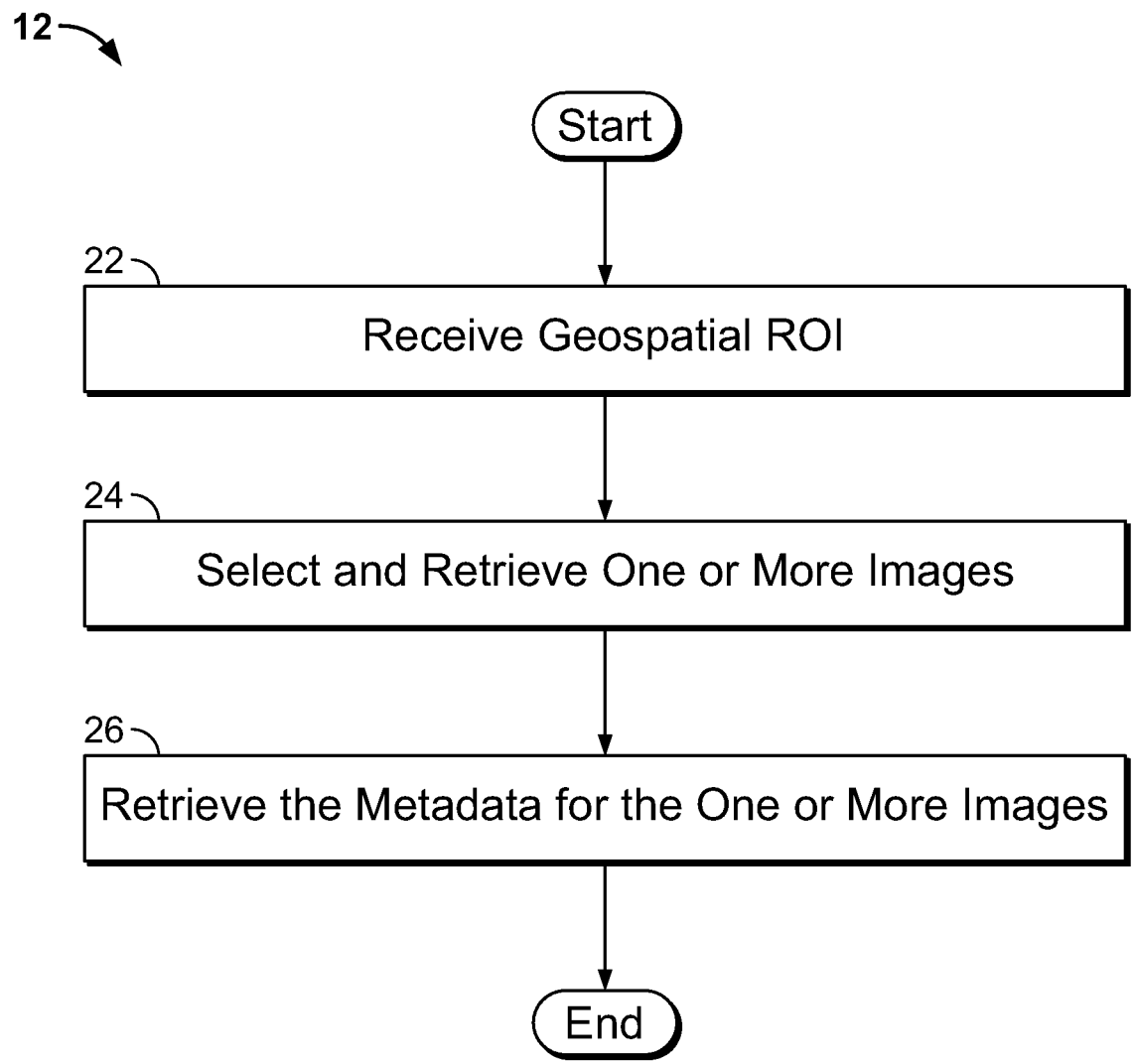
FIG. 3 is a flowchart illustrating step 12 of FIG. 1 in greater detail.

FIG. 3 shows a flowchart illustrating step 12 of FIG. 1 in greater detail. In particular, FIG. 3 illustrates process steps performed during the imagery selection phase. In step 22, the system receives a geospatial region of interest ("ROI"). For example, a user inputs latitude and longitude coordinates of a region. The region can be of interest to the user because the region may contain one or more buildings. In an embodiment, the geospatial ROI can be represented as a polygon bounded by latitude and longitude coordinates. A bound for the polygon can be predetermined or determined during the imagery selection phase. In a first example, the bound can be a rectangle or any other shape centered on a postal address. In a second example, the bound can be determined from survey data of property parcel boundaries. In a third example, the bound can be determined from a selection of the user (e.g., in a geospatial mapping interface). Those skilled in the art would understand that other methods can be used to determine the bound of the polygon. The ROI may be represented in any computer format, such as, for example, well-known text ("WKT") data, TeX data, Lamport TeX ("LaTeX") data, HTML data, XML data, etc.

In step 24, the system selects and retrieve one or more images based on the geospatial ROI. For example, after the user selects the geospatial ROI, one or more images associated with the geospatial ROI are selected and retrieved from a database. As mentioned above, the images can be digital images such as aerial images, satellite images, ground based images, etc. However, those skilled in the art would understand that any type of images (e.g., photograph, scan, etc.) can be used. It should be understood that multiple images can overlap all or a portion of the geospatial ROI. A single image or multiple images can be selected depending on the size of the geospatial ROI and whether later phases (e.g., the line extraction phase, the line graph phase and the 3D reconstruction phase) require multiple images or whether the single image is sufficient for the processes of the later phases. In an embodiment, nadir image captures, where the camera is above the objects or structures and is pointed straight down towards the ground, can be used when using a single image. Oblique image captures can be used for, among other things, determining an elevation of property features. However, it should be understood that images which cover the geospatial ROI and in which the geospatial ROI is close to the center of the image can be preferred for detecting property features of the roof. This is because camera distortion is more pronounced along the image edges than in the center. The selected image can be cropped around the geospatial ROI. Further, padding or margin can be added to provide context. It is noted that the discussion herein makes reference to a single image being selected. However, as indicated above, multiple images can also be used by the methods and systems of this disclosure.

In step 26, the system retrieves metadata for the selected image. The metadata can include data about the camera used to capture each selected image, such as but not limited to, intrinsic and extrinsic parameters of the camera. The intrinsic parameters can include the internal structure and specifications of the camera, such as a focal length and an internal translation of the camera. The extrinsic parameters can include a location and an orientation of the camera at the time the image was captured. It should be understood that the intrinsic parameters can be shared among multiple images captured with the same camera and the extrinsic parameters can be unique to each image.

Figure 4:
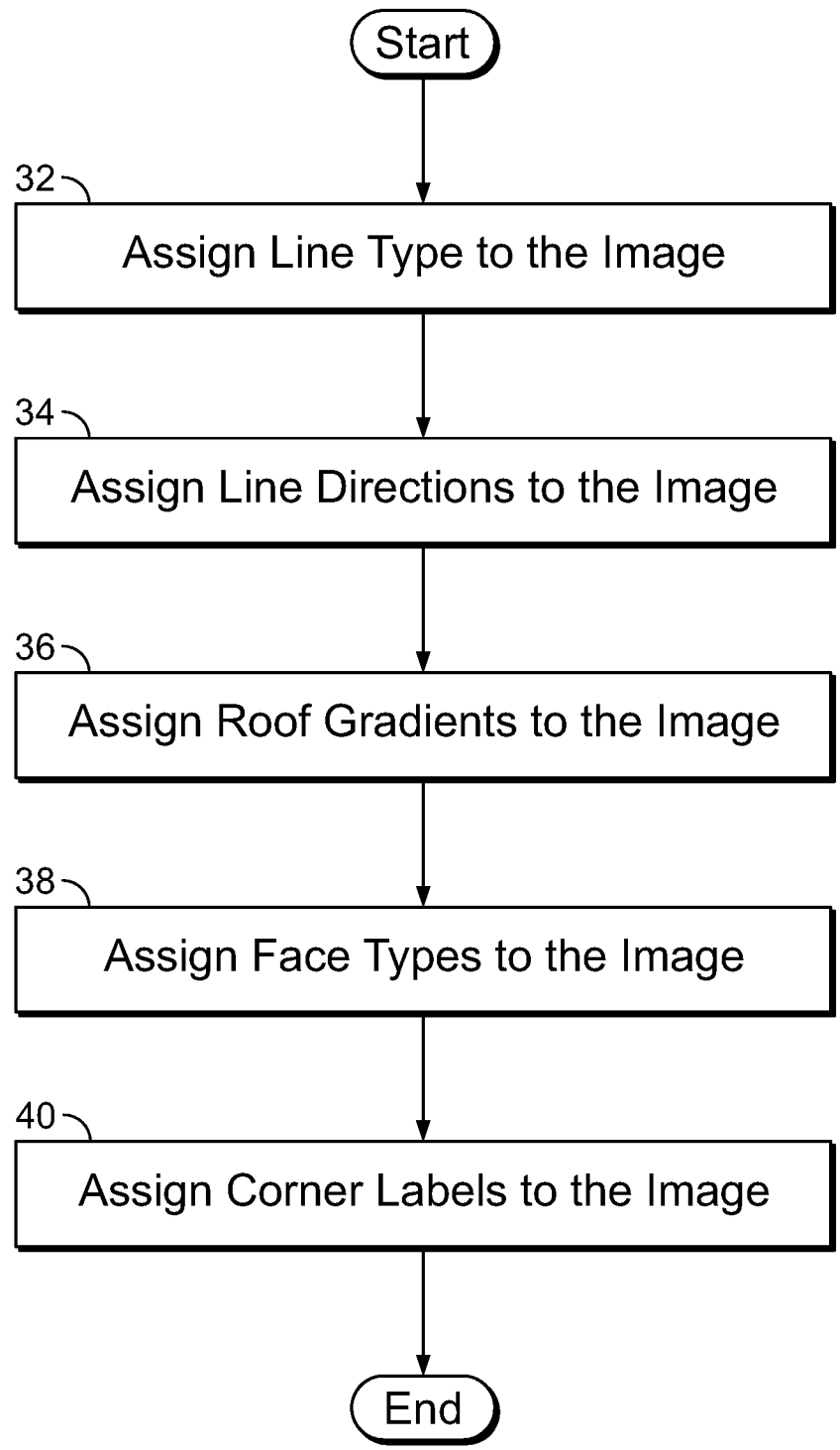
FIG. 4 is a flowchart illustrating step 14 of FIG. 1 in greater detail.

FIG. 4 shows a flowchart illustrating step 14 of FIG. 1 in greater detail. Specifically, FIG. 4 illustrates the process steps performed during the neural network inference phase.

More specifically, the neural network inference phase includes a neural network (or another computer vision system) which generates annotations of the roof in the images retrieved in the imagery selection phase. As discussed above, the roof is merely an embodiment, and the annotations, or any other process discussed throughout this disclosure, can be applied to any structure. The annotations can be pixel-level annotations which include, but are not limited to, roof line types, roof line directions, roof gradient, corner locations, face types, etc.

Figure 5A:
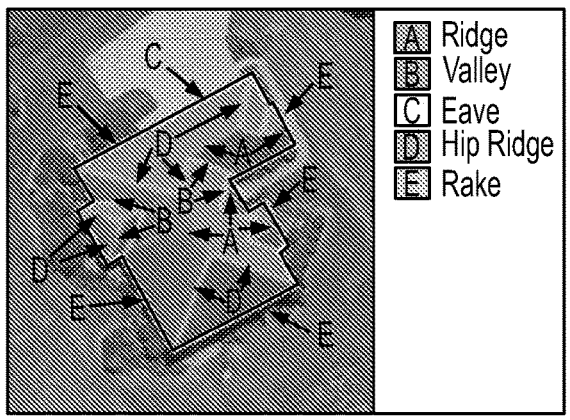
FIGS. 5A-5D are diagrams illustrating assignment of labels by the system to roof structures in images.

In step 32, the system assigns line type labels to the roof detected in the retrieved image. The line type labels indicate a type of line identified. For example, the line type labels can include eaves, rakes, hips, valleys, flat valleys, and ridges. FIG. 5A illustrates the system assigning the line type labels.

Figure 5B:
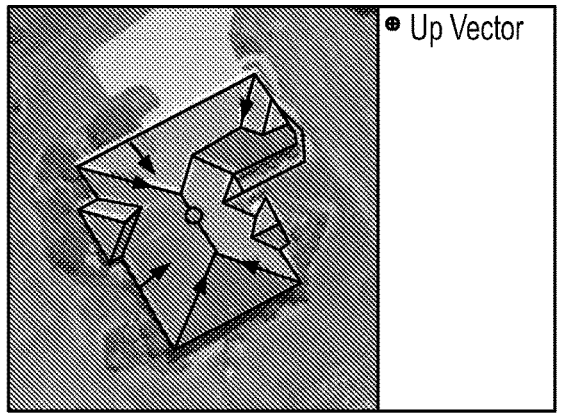

In step 34, the system assigns line direction labels to the roof detected in the retrieved image. The line directions labels indicate a primary orientation of each line labeled in step 32. In an embodiment, the direction for each line can be defined as an uphill direction in pixel space. The direction of the rakes, valleys, and hips can then be oriented with the line (e.g., the direction of a rake line is oriented along the rake line). The directions of the eaves and flat valleys may be oriented perpendicular to the line (e.g., the direction of an eave line is perpendicular to the eave line). It should be noted that flat ridges may not have an uphill direction. FIG. 5B illustrates the system assigning the line direction labels.

Each pixel can be assigned a label representing a vector. In a first example, flat ridges are assigned a label representing a vector of [0, 0, 1] as their direction, where an assignment of 1 indicates a vertical direction. In a second example, non-line pixels are assigned a label representing a vector of [0, 0, −1]. The non-line pixel can, for example, be a background pixel. Labels (e.g., 0-9) can be used to represent vectors such that a classifier is applied. For example, a label 0 can represent the background, a label 1 can represent that a line direction is vertical, and labels 2-9 can represent a direction. More specifically, the labels 2-9 can represent vectors spaced equidistant around a unit circle in pixel space starting with the positive x direction. The classifiers will be discussed in more detail below. The vectors corresponding to the line labels can be reconstituted via a weighted average. The weighted average can be based on, for example, "softmax" probabilities and corresponding direction vectors. It should be understood that the line type label and the direction vector can be used to segment out line instances in a later phase (e.g., the line extraction phase).

Figure 5C:

In step 36, the system assigns roof gradient labels to the roof detected in the retrieved image. The roof gradient labels indicate a unit vector of each pixel representing a direction in which the roof is sloping. The direction is indicated in pixel space. The roof gradient labels will be used in the line graph construction phase to reconstruct connected line segments. For example, a valley line segment may be attached to the gradients on the left and right side of the slope. From the attachment, eaves and/or rake line segments on each side of the valley may be identified, connecting all the edges together. The direction the roof is sloping may allow for the application of the constraints over possible configurations of a final line graph. FIG. 5C illustrates assignment by the system of the roof gradient labels.

In step 38, system assigns face type labels to the roof detected in the retrieved image. The face type labels indicate special roof subsections that are to be handled by special rules. For example, the face type label can be assigned to pixels that include extensions (e.g., a carport), chimneys, crickets, terraces, etc, so that the pixels can be removed from consideration. The face type labels can also be assigned to regular roof faces and walls.

Figure 5D:

In step 40, the system assigns corner labels to the roof detected in the retrieved images. The corner labels indicate intersections between line segments. The corner labels can aid in identifying line segments that may have been missed in a first pass of identifying the line segments in the images. For example, the corner label can identify the missed line segments by adding constraints to the regions in which line segment intersections can happen. In an embodiment, the corners are assigned labels describing the type of segments that caused the corner to form. For example, the assigned label can identify an eave and eave corner, a flat ridge and a rake corner etc. FIG. 5D illustrates assignment of the system of the corner labels.

The assignments performed by the system in FIG. 4 can be referred to as neural network outputs. In more specific situations, the assignments performed in each step in FIG. 4 can be referred to as an output of the type of assignment in that step. For example, the result of assigning the line direction labels can be referred to as the line direction outputs. It should be understood that the neural network phase may assign additional labels to the structure in an image. Furthermore, it may be sufficient to use only one labeling process or any combination of the above discussed labeling processes during the neural network inference phase.

Figure 6:
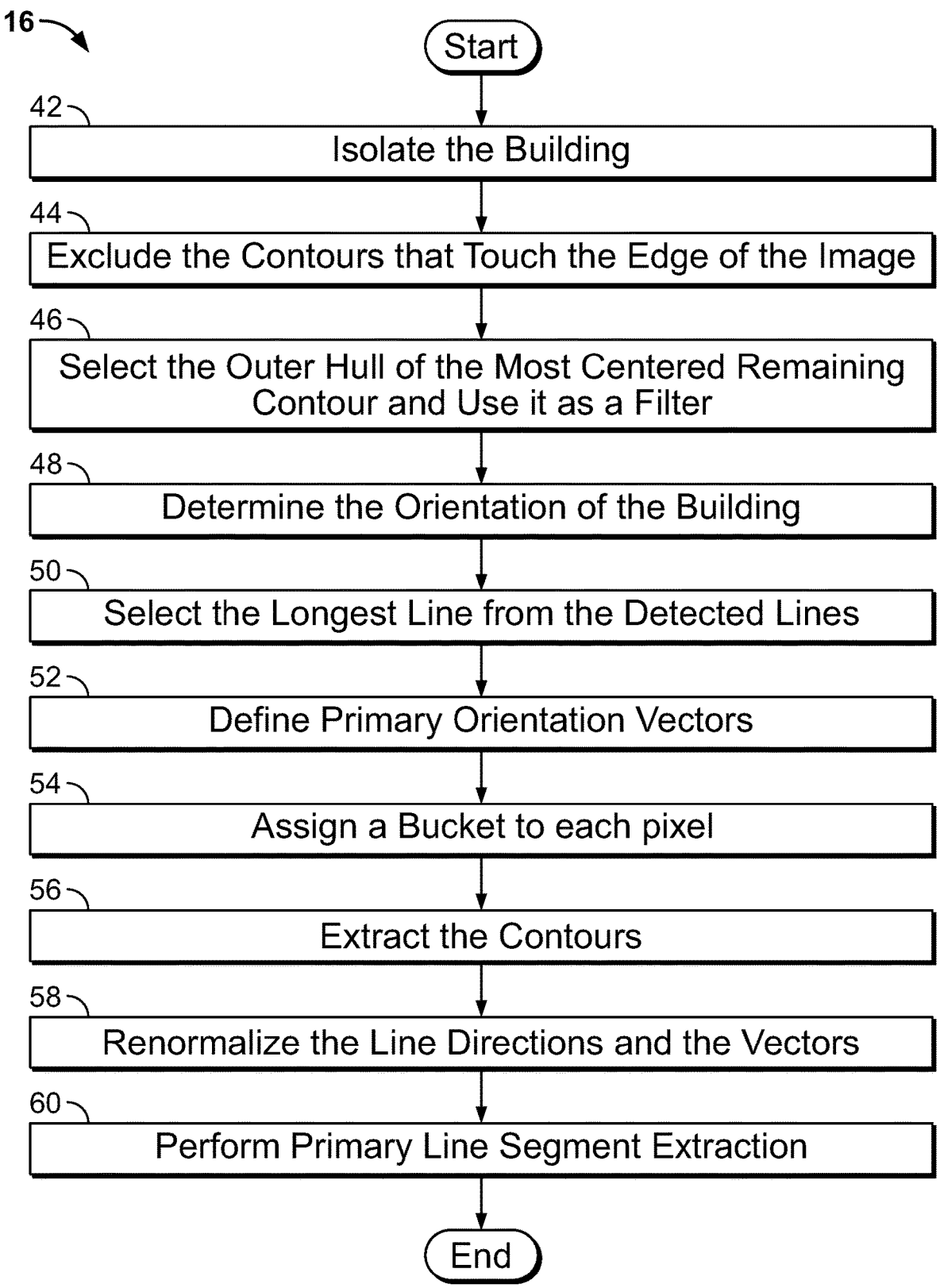
FIG. 6 is a flowchart illustrating step 16 of FIG. 1 in greater detail.
Figure 7:
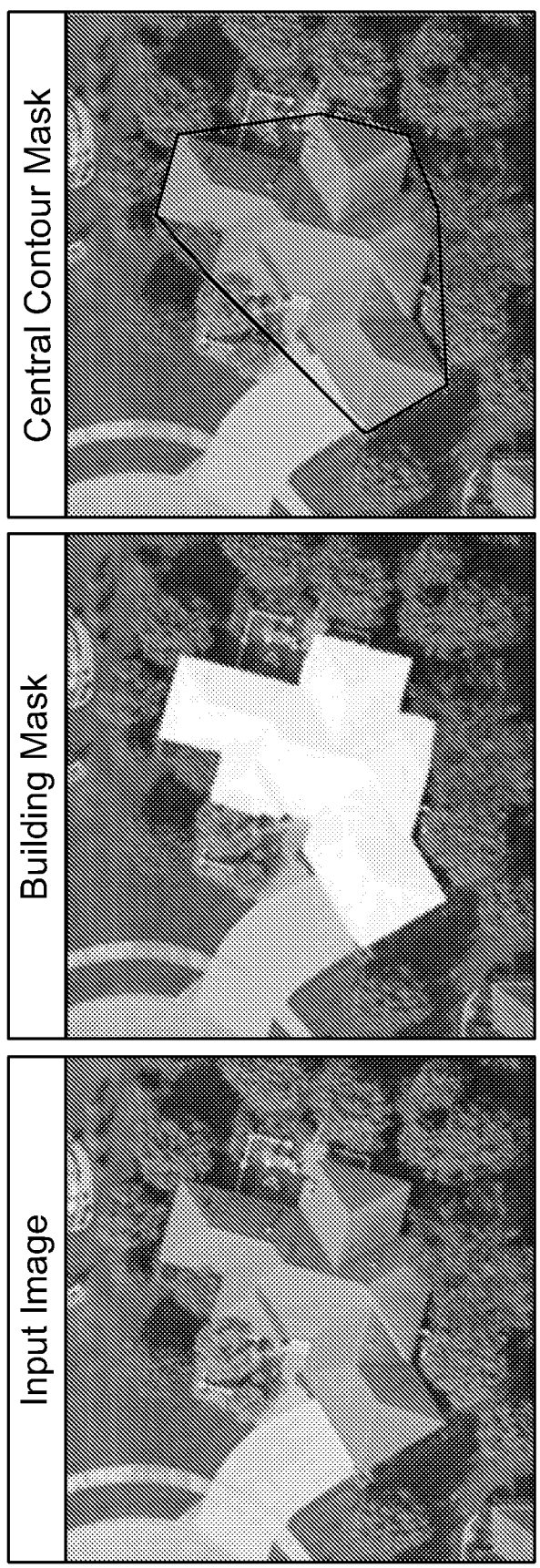
FIG. 7 is a diagram illustrating how the system generates a central contour mask.

FIG. 6 shows a flowchart illustrating step 16 of FIG. 1 in greater detail. Specifically, FIG. 6 illustrates process steps performed during the line extraction phase. It should first be noted that the building in the image may have a primary orientation. The orientation of the building can be used to refine the neural network outputs from the neural network inference phase. However, prior to determining the orientation of the building, it can be desirable to isolate the building first. In step 42, the system uses the neural network outputs to extract contours from the non-background labels. Preferably, the face type outputs (e.g., the walls) are used. In step 44, the system excludes contours that touch the edge of the image. In step 46, the system selects the outer hull of a most centered remaining contour (the centered contour), as illustrated in FIG. 7. The selected outer hull can be used as a filter to remove non-relevant neural network outputs. It should be understood that by removing the non-relevant neural network outputs, the amount of work to be required in processing the remaining neural network outputs and the chance of choosing an incorrect primary orientation can be reduced.

Figure 8:
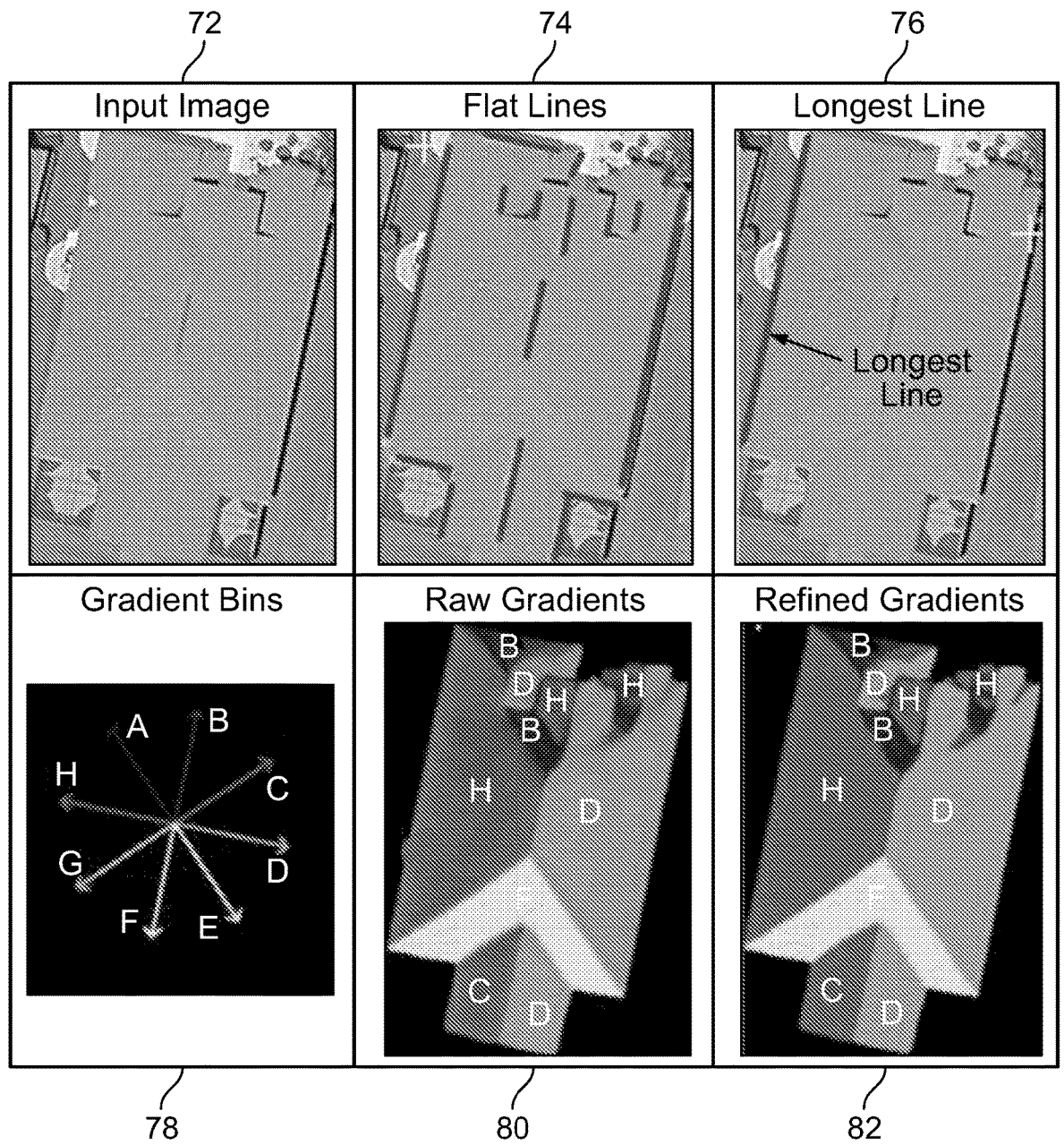
FIG. 8 is a diagram illustrating how the system determines the longest line segment in an image and generates refined gradients.

In step 48, the system determines the primary orientation. As discussed above, the primary orientation can be the orientation of the building in the image. To determine the primary orientation, a line detection algorithm is applied to the neural network outputs of the centered contour. The line detection algorithm can be applied to the flat ridge and eave line type neural network outputs of the central contour. The flat ridge output and the eave line output are preferred because they correspond to a flat line. In step 50, the system selects the longest line from the line segments detected in the step 48. For example, as illustrated in FIG. 8, the flat line segments are detected 72 from the input image 72 during the neural network inference phase, and the longest line segment is selected 76 from the flat line segments. The longest line segment selected can be defined as a roof basis function. In step 52, the system defines primary orientation vectors from the roof basis function. As noted above, the line detection phase can define eight primary orientation vectors and the primary orientation vectors can be spaced at equidistant angles around a unit circle. The unit circle can be in pixel space. Those skilled in the art would understand that eight primary orientation vectors being spaced at equidistant angles is only an example, and that any number of orientation vectors can be used and spaced at any angle.

In step 54, system assigns a bucket to each pixel. For example, the roof gradient outputs are assigned to a first bucket (e.g., a gradient bucket) based on the primary orientation vectors, the flat roof faces are assigned to a second bucket (e.g., a flat roof face bucket) and the non-line pixels (e.g., the background pixels) are assigned to a third bucket (e.g., a non-line pixels bucket). As illustrated in FIG. 8, the gradient buckets 78 can be used to generate refined gradients 82 from raw gradients 80. Those skilled in the art would understand that any number of buckets can be used for any number of the neural network outputs and the buckets can be assigned to the neural network outputs based on any characteristic of the neural network outputs. In step 56, the system extracts contours for one or more of the neural network outputs. The extracted contours are used to reconstruct a graph containing the roof edges in the line graph construction phase.

In step 58, the system renormalizes the line direction outputs. First, it should be noted that the roof may not be oriented with the image. Second, it should also be noted that, as discussed above, the line direction outputs may have been assigned a label of classification ranging from 0-9, where the classification 0 indicates a non-line pixel, the classification 1 indicates a vertical line pixel, and the classification 2-9 indicating the equidistant vectors. The line direction classification can have a format of [classification 0, classification 1, classification 2, classification 3, classification 4, classification 5, classification 6, classification 7, classification 8, classification 9]. The value for each classification can represent a probability that the pixel is of a type designated by the classification. For example, a direction label for a pixel may be [0.0, 0.0, 0.1, 0.01, 0.6, 0.4, 0.1, 0.01, 0.01, 0.0]. The classifications of the direction label would, therefore, indicate a 0% probability that the pixel is the background in the image, a 0% probability that the pixel is a vertical pixel, a 10% probability that the pixel is in the direction of vector 1, a 1% probability that the pixel is in the direction of vector 2, a 60% probability that the vector is in the direction of vector 3, a 40% probability that the vector is in the direction of vector 4, a 10% probability that the vector is in the direction of vector 5, a 1% probability that the vector is in the direction of vector 6, a 1% probability that the vector is in the direction of vector 7, and a 0% probability that the vector is in the direction of vector 8.

Since the roof may not be oriented with the image, to renormalize the line direction outputs, the 0-9 label can be adjusted so the first angle offset (the angle corresponding to classification 2) is in the same direction as a basis vector. In an embodiment, the 0-9 label can be adjusted by reconstituting a vector form of the classification by computing the weighted average of the direction and re-normalizing the vector for each pixel. Pixels with the classification of 0 or 1 (e.g. the background pixels and the vertical pixels) can keep their original labels. Pixels with the classification of 2-9 (e.g., the eight cardinal vectors) can be phase shifted so that the first vector lines up with the roof basis function. Next, each pixel is reassigned to the cardinal vector it is closest to. It should be understood that refining the directions, as discussed in step 58, may allow for an application of tighter orientation constraints for extracted line segments. In step 60, the system performs a primary line segment extraction.

Figure 9:
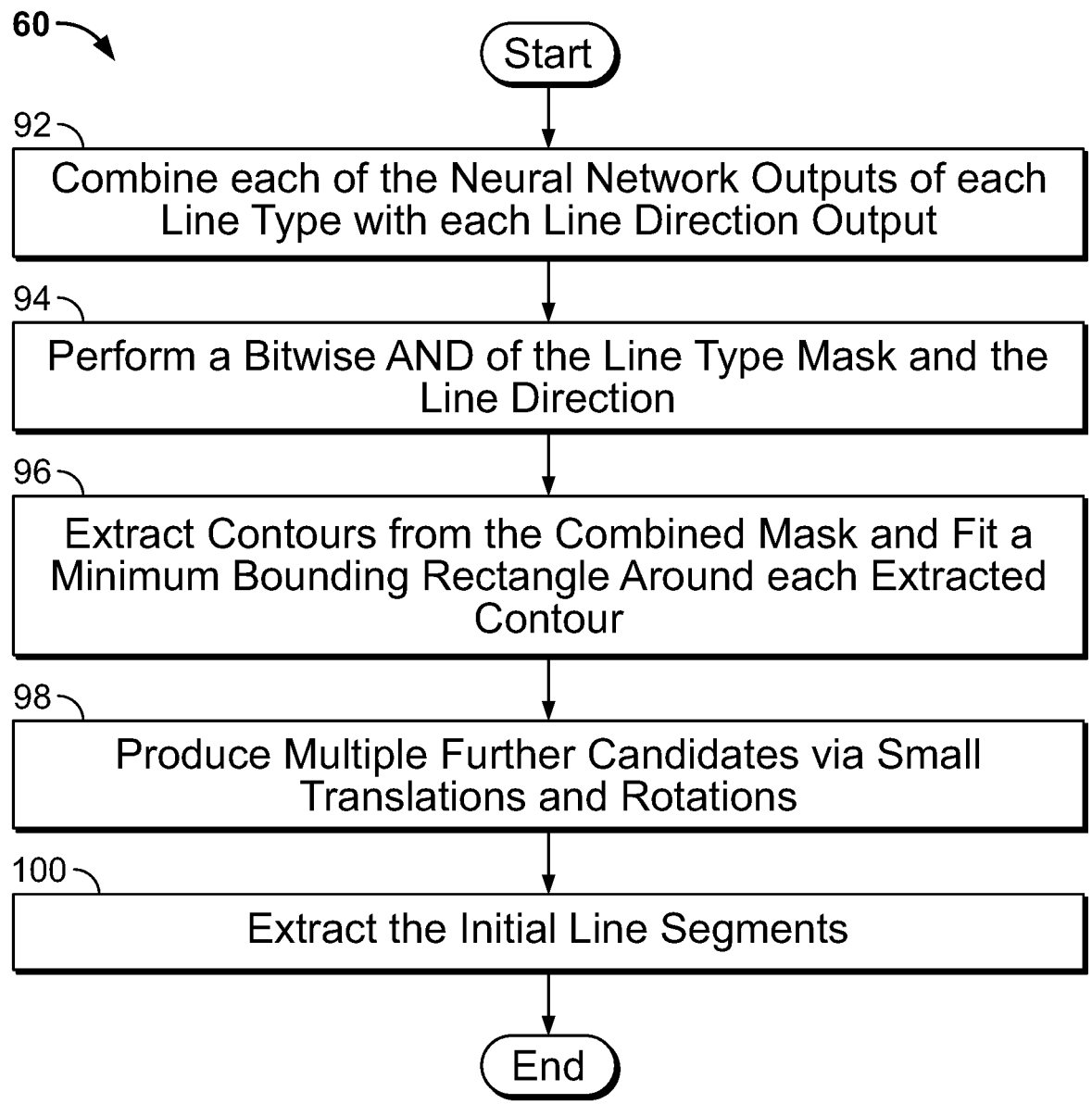
FIG. 9 is a flowchart illustrating step 60 of FIG. 6 in greater detail.

FIG. 9 shows a flowchart illustrating step 60 of FIG. 6 in greater detail. In step 92, the system combines each of the neural network outputs of each line type with each line direction output. The system sets the pixels of a first line type to a first threshold value on a line type mask, such as an eight-bit mask, and the pixels of a second line type to a second threshold value. For example, the pixels with the eave label can be set to the first threshold value (e.g., 255) on the line type mask and the non-eave labels may be set to the second threshold value (e.g., 0). The system extracts a line direction to create a line direction mask where values of the line directions are also set to the first and/or second threshold value.

In step 94, the system performs a bitwise AND of the line type mask and the line direction mask to create an output mask. The output mask corresponds to a pixel label of eave line segments in a specific direction. In step 96, the system extracts contours from the output mask and fits a minimum bounding rectangle around each extracted contour. The minimum bounding rectangle extracts a candidate line segment which passes through a center of the minimum bounding rectangle aligned with a major axis. In cases where the major axis and a minor axis are close, for example, with short line segments, the direction can be used to determine an orientation of the candidate segment. The system can determine that the major axis and the minor axis are close when they are within a predetermined distance of each other.

In step 98, the system uses the candidate line segment to produce multiple further candidates via small translations and rotations. Each candidate line segment can receive a score based on how well it lines up with the line type mask. The highest score line segment can be retained as a single output for the contour. It should be understood that combining a direction with a line type can help create better line segment instances. For example, two eave line segments in the image may not be connected but appear to be in pixel space. Without the line directions, an output may combine the eaves, when in reality they are pointing different directions.

Figure 10:
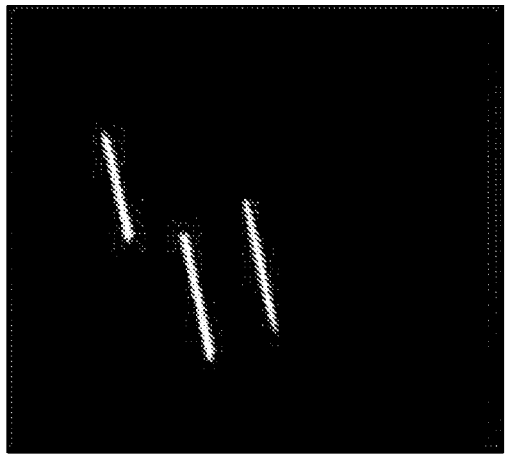
FIG. 10 is a diagram illustrating extraction by the system of primary line segments in an image.
Figure 10:
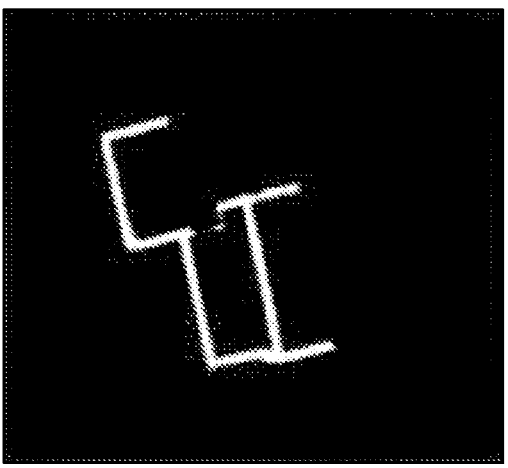
Figure 10:
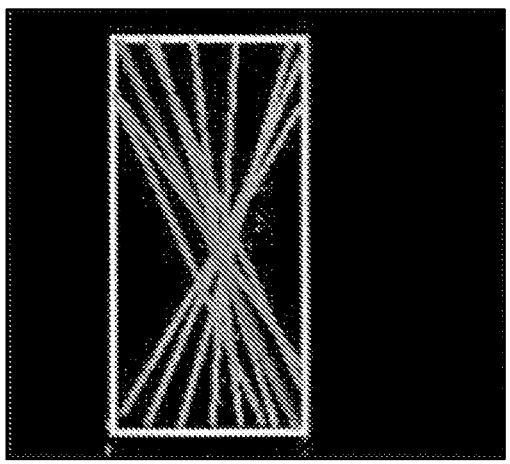
Figure 10:
Figure 10:
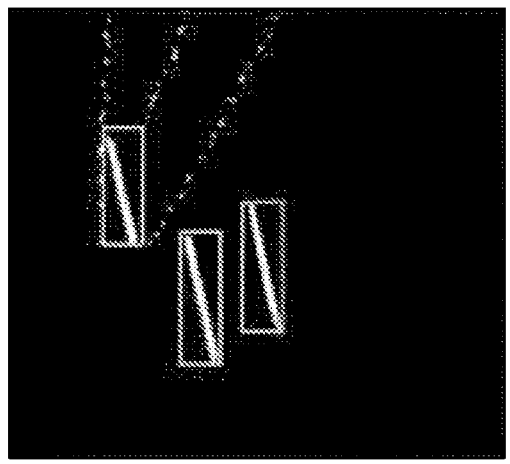

FIG. 10 is an illustration of the system performing the primary line segment extraction. It is noted that there are no connections between the line segments. For example, a first line segment, such as an eave line segment, is not connected to a second line segment, such as another eave line segment or a rake line segment. As such, a line graph of connected segments will be used to connect the line segments. The line graph of connected segments can also be used to further refine the line segments detected in the image by using intersections between adjacent line segments to refine the endpoints, identify locations where there may be a missing line segment due to, for example, a noisy or missing neural network output, or determine further missing line segments from newly available constraints.

Figure 11:
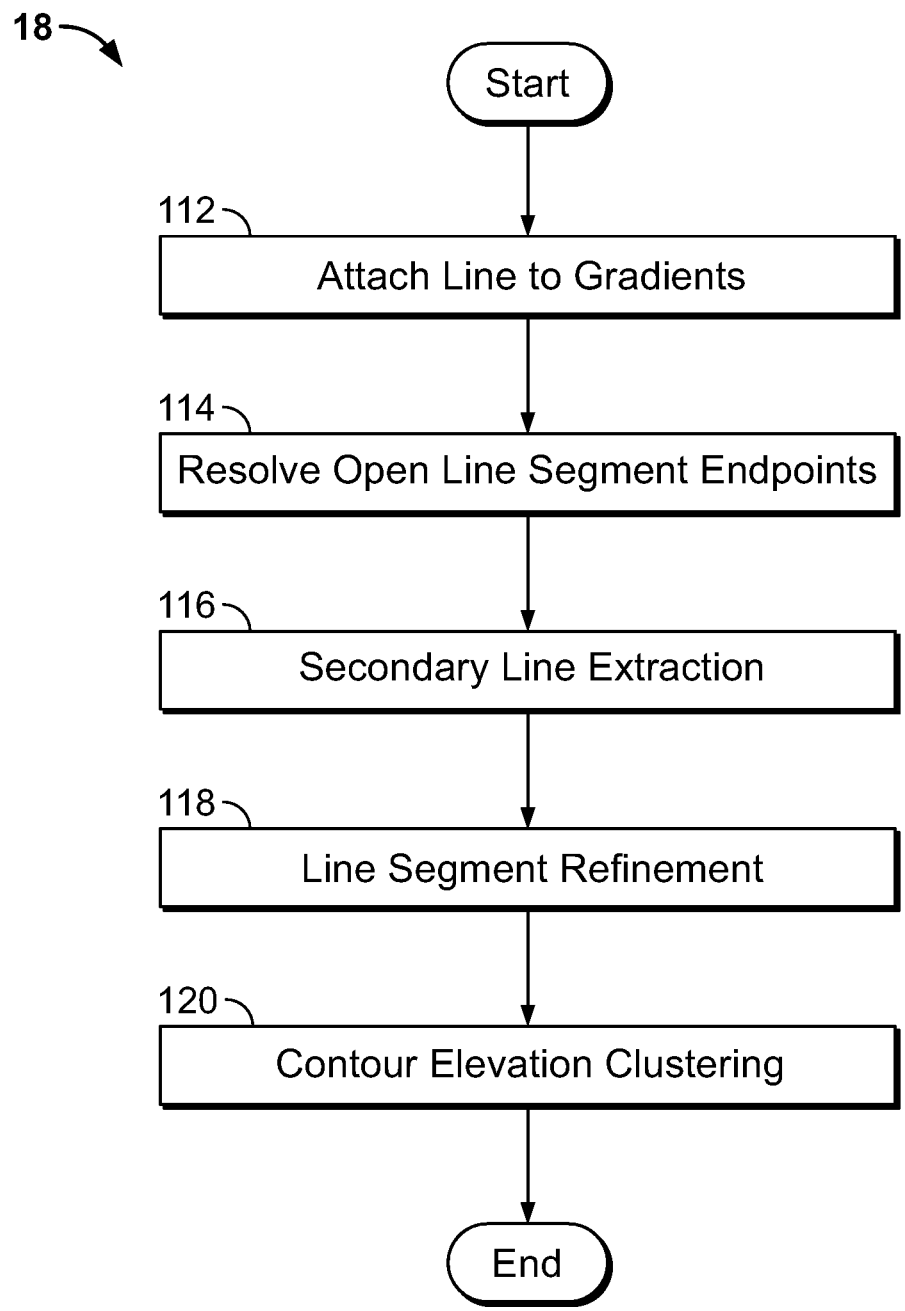
FIG. 11 is a flowchart illustrating step 18 of FIG. 1 in greater detail.
Figure 12:
FIG. 12 is a diagram illustrating attachment by the system of the line segments to gradient contours.

FIG. 11 shows a flowchart illustrating step 18 of FIG. 1 in greater detail. Specifically, FIG. 11 illustrates process steps performed during the line graph construction phase. In step 112, system attaches the line segments to gradient contours. Specifically, one or more gradient contours may be assigned to one or more line segments based on a set of predetermined rules. In a first example, an edge segment (e.g., an eave segment or a rake segment) and a flat valley segment may each be assigned a gradient contour. In a second example, each left and right side of each hip segment and valley segment may be assigned a gradient contour. In a first example, a flat ridge segment may be assigned to multiple gradient contours. In flat ridge segments where two ridges intersect, each side of the flat ridge segment may be assigned a gradient contour. It should be understood that when assigning the gradient contours to the line segments, the direction of the contour is considered so the assignment is self-consistent. FIG. 12 is an illustration of step 112.

In an example, to attach an eave segment to a gradient contour, the system determines a midpoint for the eave segment and searches for a matching gradient group that is a number of pixels to the left of the eave segment. The gradient group can be oriented so the slope of the roof is at a right angle or within a tolerance of a right angle. The tolerance can be used when the image is not nadir. In another example, to attach a hip segment or a valley segment, the system can search for gradient groups to the left side and the right side of the hip segment or the valley segment. In an embodiment, it can be assumed the gradients will be at or near 45 degrees to the hip segment or the valley segment when the image is nadir. Tolerances can be used when the image is not nadir or to allow for possible deviations. Flat ridge segments can be attached to every gradient that is perpendicular to a flat ridge segment along a length of the flat ridge segment. By attaching each line segment to a gradient group, the system can perform a refined search for connecting adjacent line segments, as will be discussed in more detail in step 114.

In step 114, the system resolves open line segment endpoints. A rule based algorithm can be used to iteratively connect open line segment endpoints (e.g., eave and rake endpoints that don't have all 'next' or 'previous' segment reference) in the line graph. For example, a contour rule based algorithm can search the line segments for remaining open endpoints. The focus of the search can be to connect the endpoints of eave and rake segments with interior line segments which can act as evidence for correct connections between eave and rake segments. It should be understood that the focus on eaves and rakes segments may be because these segments, when combined with elevation information and roof slope information, can be used as input parameters during the 3D reconstruction phase.

Figure 13:
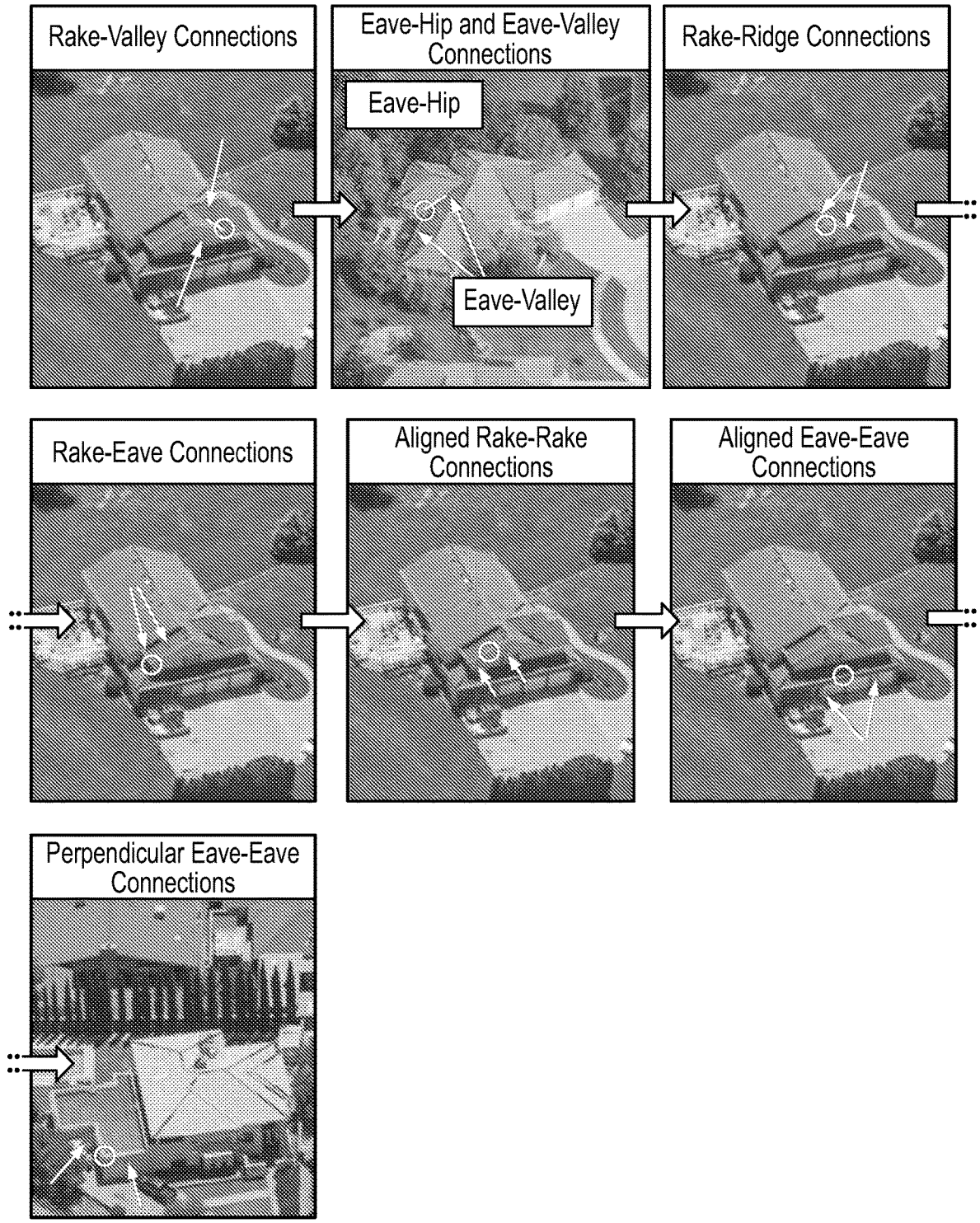
FIG. 13 is a diagram illustrating different line segment connections capable of being generated by the system.

FIG. 13 is an illustration of different line segment connections performed by the system. Specifically, FIG. 13 shows examples of different types of connection resolutions that can be performed to infer missing connections. The process may begin, for example, by resolving missing connections between rake segments and valley segments. It should be understood that other types of connection resolution can be performed to infer missing connections.

Returning to step 114, in another embodiment, gradient groups can be used when attaching edge line segments (e.g., eaves and rakes) to interior line segments (e.g., hips, valleys, and ridges). By using the gradient groups, a search to reduce incorrect connections may be narrowed. In yet another embodiment, intersections between connected line segments can lie inside of a corner according to a corner mask. If, for example, multiple line segments satisfy a set of constraints for a given connection, the line segment which minimizes a distance to the intersection point from the considered line segments can be selected. When a line segment, such as an interior line segment, is attached to another line segment, such as to an eave segment or a rake segment, the side of the attachment (e.g., left, right, etc.) is recorded.

Once the edges are connected to the interior line segments, attached left and right edges of the interior line segments can be used to transitively connect the edges. For example, if a rake segment is attached to the left of a valley segment and an eave segment is attached to the right of the same valley segment, then the next edge of the left rake segment can be set as the right eave segment.

Figure 14:
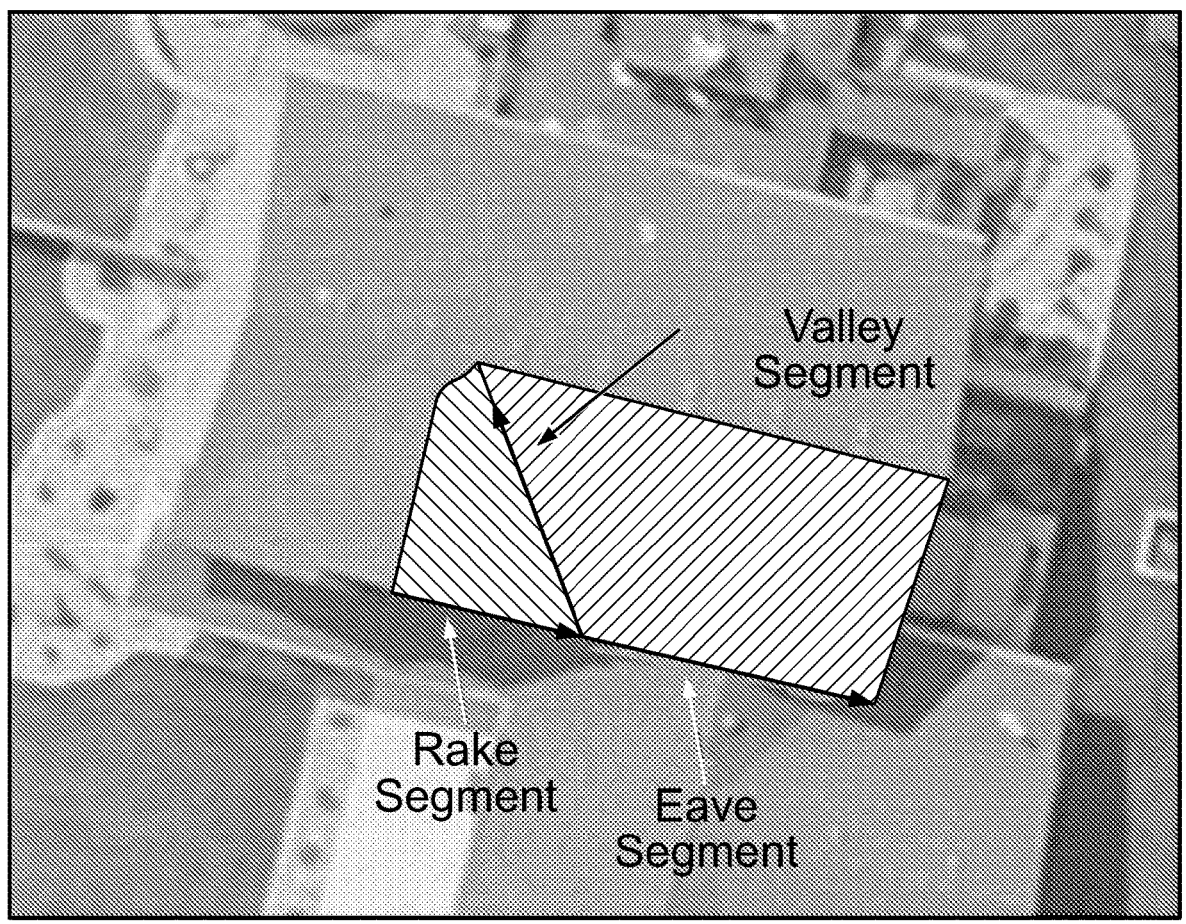
FIG. 14 is a diagram illustrating generation by the system of an inference that a rake line segment and an eave line segment should be connected to each other.

FIG. 14 is an illustration of a valley segment that is attached to a rake segment and an eave segment being used to infer that the rake segment and eave segment should also be connected to each other. The output can be referred to an edge graph. Connecting the edges to the interior line segments can be a first pass of the line graph construction phase. However, line segments can be missing due to noise from the neural network outputs or from other sources. As such, a second pass (e.g., a secondary line extraction) can be performed. The second pass focuses on locations where our graph is incomplete. The second pass can verify whether a candidate line matches enough of a network output to be added to the graph.

Referring back to FIG. 11, in step 116, the system performs a secondary line extraction, where interior line segments are used to find missing edges. In a scenario where there are two interior line segments (e.g., a hip segment and/or a valley segment) connected to a same gradient contour, the system can create a candidate line segment between bottom ends of the line segments. The system can then compute a score for the candidate line segment by using the neural network outputs. In an example, it can be required that intersections lie inside of the corner outputs. If the score is higher than a threshold value, the candidate line segment is added to the line graph. Similarly, the system can search for missing eave segments between interior segments and rake segment. This process can be repeated until the system no longer detects new segments. It is noted that the line graph may still have incomplete connections after step 116, but the line graph should be consistent with the neural network outputs.

Figure 15:
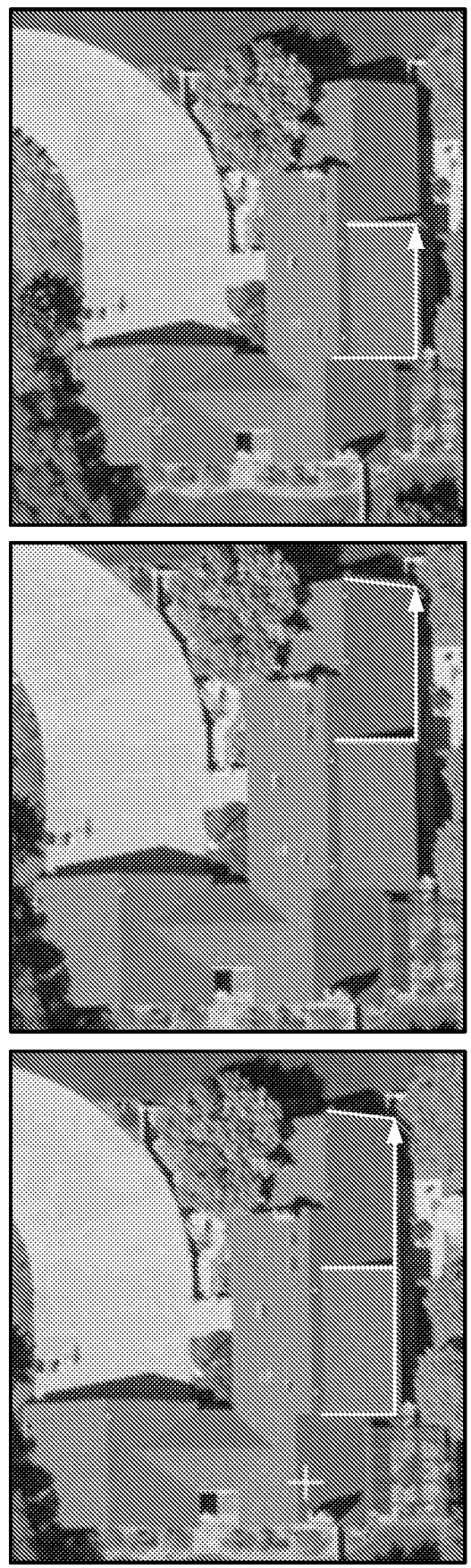
FIG. 15 is a diagram illustrating the system splitting an eave line segment because of a elevation discontinuity.

In step 118, the system performs a line segment refinement. Specifically, the system uses the line graph to refine the endpoints of line segments by extending or clipping the line segments using intersections between next, adjacent, and interior line segments. The system can also use the basis vector to calculate primary orientations for horizontal line segments in world space using the camera parameters. Eave segments can then be connected to the horizontal line segments. Additionally, an eave segment or a rake segment can be split because of discontinuities in world space elevation, even though a single line segment in pixel space matches the line segment. The system may identify these embodiments by searching for rake segments that intersect in the middle of eave segments, and eave segments that intersect in the middle of rake segments. The system can then split the line segments at the intersect points. FIG. 15 is an illustration splitting an eave segment because of an elevation discontinuity by identifying a rake segment.

In step 120, the system performs a contour elevation clustering. Specifically, the system adds elevation information onto the edges of the line segments. The system can use elevation data from 3D data to add the elevation information, generate the elevation data from one or more images and/or the 3D data, or any combination thereof. The 3D data can include include, but is not limited to, light detection and ranging ("LIDAR"), point cloud, feature triangulation, etc. In an embodiment, for flat line segments, such as eave segments, flat valley segments, and ridge segments, the system can use elevation data of the flat line segment and/or the camera metadata to transform the flat line segment into world space. For sloped line segments, such as rake segments and valley segments, the system can transform the sloped line segment into world space using an elevation of any two pixels in the sloped line segment, or alternatively, using a single pixel and a slope of the sloped line segment in world space.

The system can determine the elevation information using multiple images. In a first embodiment, the system generates a disparity map using the camera metadata and generating a point cloud. The point cloud is then projected onto views to infer elevations for the line segments. In a second embodiment, the system matches line segments between multiple views from multiple images and uses this correspondence to generate a set of line segments in world space. The system then projects the line segments back onto an image to add the elevation information onto three dimensional ("3D") line segments. This process can introduce noise. For example, when matching line segments between multiple views, there can be line segments for which a match cannot be found, an incorrect match is found, or other issues, such as inaccuracies from a level of precision of the image metadata and from the accuracy of line segments recovered from the neural network outputs. These embodiments can attach all of some of the line segment with elevation and/or slope information. The system can then minimize inaccuracies of the added elevation and add missing data using constraints relevant to the geometry of the roof.

Figure 16:
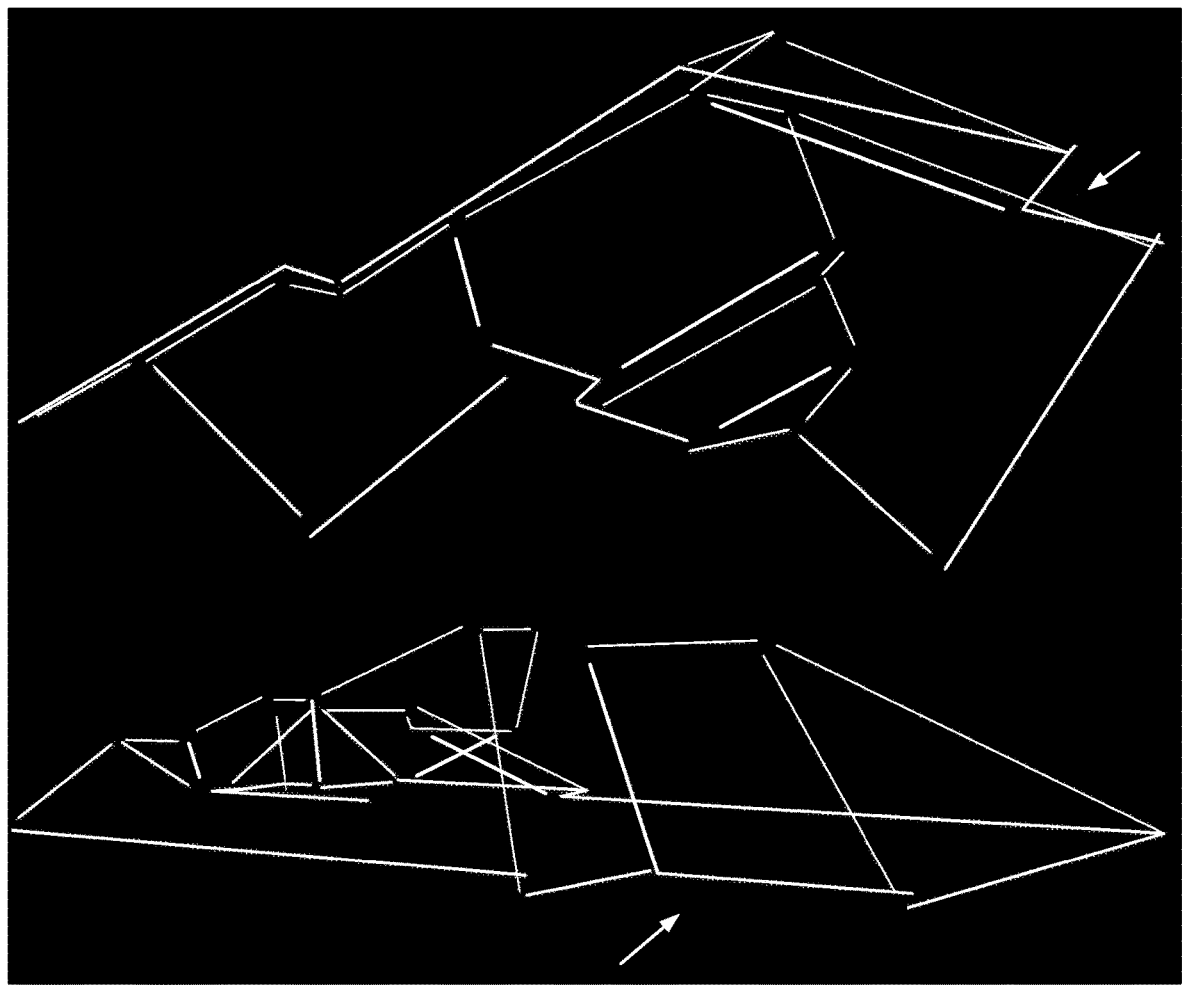
FIG. 16 is a diagram illustrating eave line segments being clustered together.

The first constraint is that roofs can have grouped contour elevations, including when the individual contours are spatially separated. For example, for a gable roof with two eaves that are close to the same elevation according to the 3D data, the system can assume that the two eaves are at the same elevation. As such, if the system determined that the two eaves have different elevations, the system can deem that determination to be inaccurate. The system can apply this principle to the entire roof by, for example, clustering all distinct elevation values and into distinct elevation groups. For example, the system can use a clustering method such as a density-based spatial clustering of applications with noise ("DBSCAN") algorithm. However, those skilled in the art would understand that any clustering method can be used. For each elevation group, the system can set all segments in a cluster to a height of a cluster centroid. FIG. 16 illustrates clustering eave segments with other eave segments to set a consistent elevation.

Rake segments can be assigned to a cluster based on an elevation of their lowest point. It should be noted that rake segment elevations can have more uncertainty since rake segments only have a single point at a given elevation. As such, the rake segments may not be used to determine clusters, but, rather, once the clusters are calculated, the system can assign the rake segments to a cluster. Line segments for which an elevation is not determined can be assigned to an unknown elevation group.

In an embodiment, slope information can be added to rake segments using the elevation information attached onto each rake segment. The system can apply a constraint that slopes that are close to each other are the same slope. To group the slopes, the system can round each slope to a predetermined rounding value. For example, the system can round each slope to the nearest inch over a 12-inch value. The system can then generate a histogram of the values. In an embodiment, hip line segment, valley segment, and rake segment slopes are used as inputs with the hip slopes and valley slopes adjusted to consider that they do not run parallel to a gradient of roof face slopes. The maximum value in the histogram can be used as the default slope. Rake segments that are within a predetermined value, (for example, 1 inch over 12 inches of the default slope) are set to have the default slope. Additional slope constraints can be added based on valid roof configurations. For example, if two rakes are attached to the same eave, they can be considered to have the same slope because they belong to the same roof face. Those skilled in the art would understand that these principles can be used with other line segments.

The system can then build a refined edge graph using the rules described to generate the edge graph, but with added constraints that connected edges come from the same elevation cluster. Line segments belonging to the unknown elevation group can be connected to any line segment. Once an edge connection is made, a line segment(s) belonging to an unknown elevation group is assigned to the group of a line segment it is connected to. Traversing the roof edge types (e.g., the eave segments and rake segments), the system can construct a list of connected edge sequences, with every edge in each sequence having a same elevation.

Figure 17:
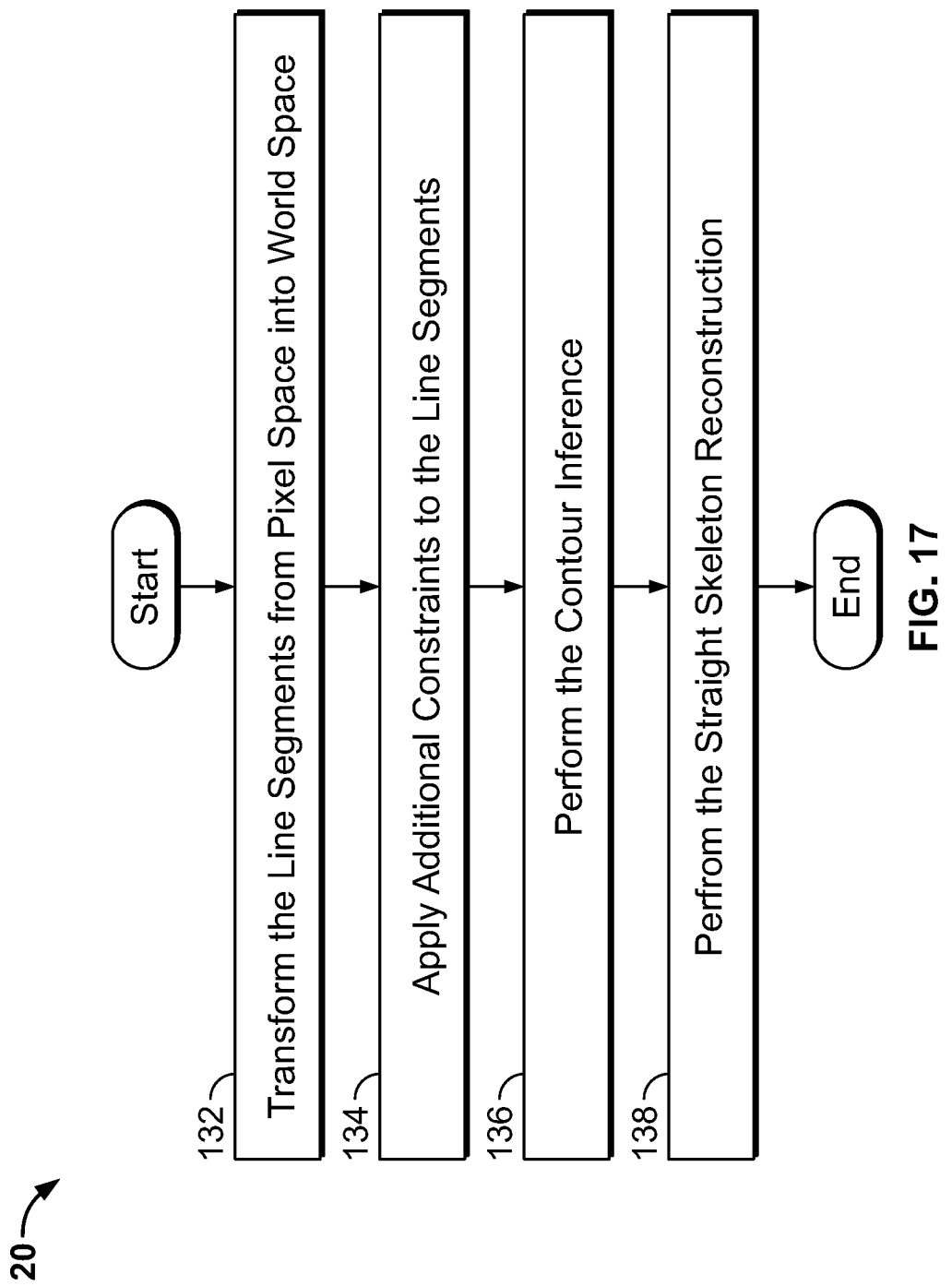
FIG. 17 is a flowchart illustrating step 20 of FIG. 1 in greater detail.

FIG. 17 shows a flowchart illustrating step 20 of FIG. 1 in greater detail. Specifically, FIG. 17 illustrates process steps performed during the 3D reconstruction phase. More specifically, the 3D reconstruction phase generates a 3D representation of the roof in world space. In step 132, the system transforms the line segments from pixel space into world space. The system can use the edge sequence elevation to construct a horizontal plane and project each eave segment from the pixel space to the world space. For rake segments, the system can use the elevation and the slope constraints to project the rake segment into the world space. Connections between the line segments are maintained during the projection from pixel space to world space.

Figure 18:
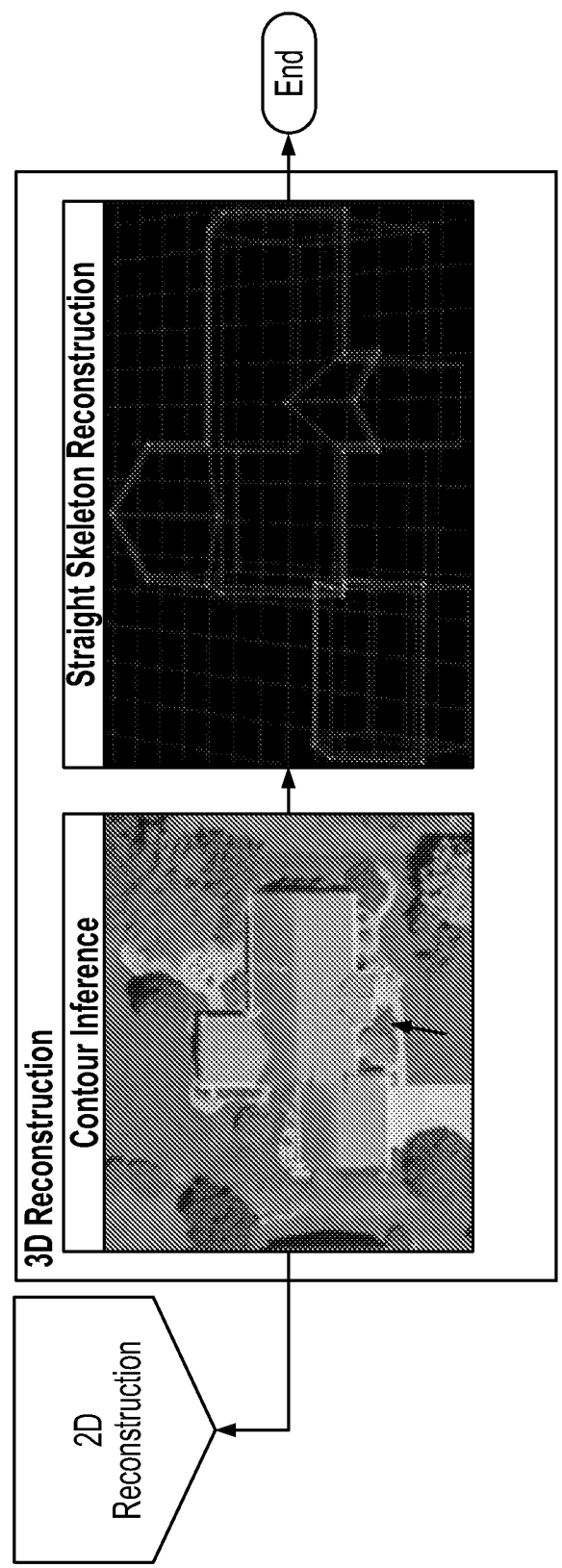
FIG. 18 is a diagram illustrating a 3D reconstruction workflow performed by the system.

In step 134, the system applies additional constraints to the line segments. The additional constraints can include rectifying parallel, perpendicular, and collinear line segments. It should be noted that the 3D representation may be missing some information to reconstruct a complete valid roof. However, the system can proceed with the assumption that while the roof may be incomplete, the 3D edge sequences produced are valid. Although the assumption can be inaccurate, the assumption allows the system to proceed with the 3D reconstruction over a much more constrained search space for a final roof configuration. FIG. 18 shows an example of 3D reconstruction work flow. In this example, the 3C reconstruction phase begins by completing any open endpoints in the line graph. Once the line graph is completed, the line graph can be used as input into a straight skeleton algorithm. The straight skeleton algorithm can infer any remaining interior roof line segments.

Figure 19:
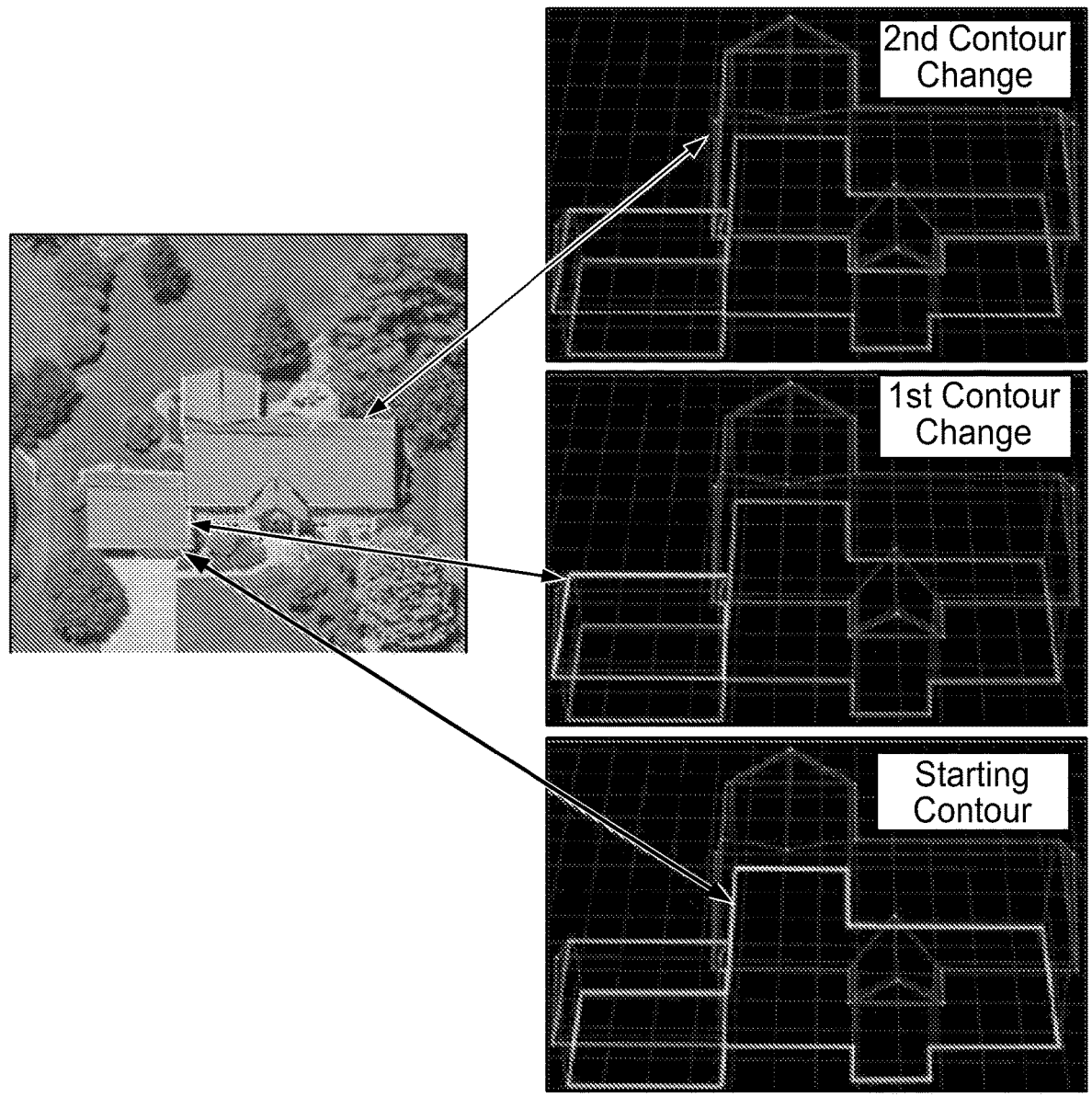
FIG. 19 is a diagram illustrating a sample input image and the resulting completed contour generated by the system.

In step 136, the system performs a contour inference. Specifically, the system infers the exterior contours at each elevation from the line graph. FIG. 19 is an illustration showing a sample input and resulting completed contours. As shown in FIG. 19, a starting contour is a closed polygon that represents the lowest elevation on the structure, which can be a base of the walls of the structure. The starting contour is generated by lowering all line segments in the line graph to a ground elevation and inferring missing sections of the resulting polygon. It should be understood that there may be no missing sections. The first contour change shows where the roof structure starts being tied into a straight skeleton. The second contour change is used to tie in an upper structure of the roof. In each of the contour groups there may be missing segments that can be inferred by searching the line graph for open connections. The output from the contour inference is a set of contours that can be used as a starting point for the next algorithm which infers the interior roof line segments of the structure.

Figure 20A:
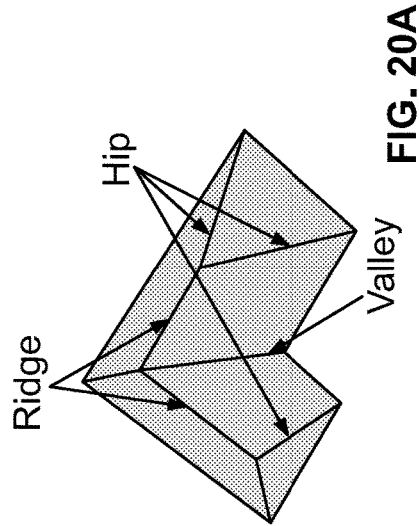
FIG. 20A is a diagram illustrating interior line segments of a structure model generated by the system.
Figure 20B:
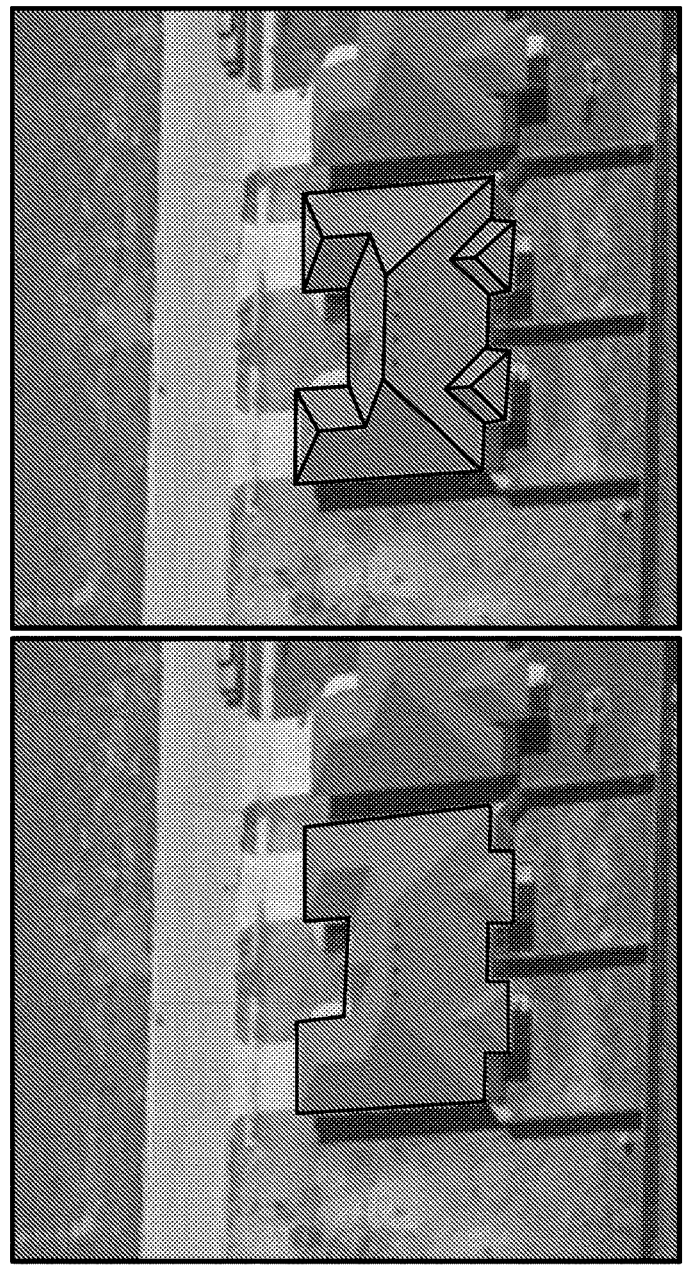
FIG. 20B is a diagram illustrating application of a straight skeleton algorithm by the system.

In step 138, the system performs a straight skeleton reconstruction. Specifically, the system can take the closed exterior roof contours at different elevations and determine their interior line segments. Different types of interior line segments are determined, which can include hip line segments, valley line segments, ridge segment, etc. FIG. 20A is an illustration showing the interior line segments. FIG. 20B is an illustration showing a situation where the straight skeleton reconstruction can be utilized.

Figure 21:
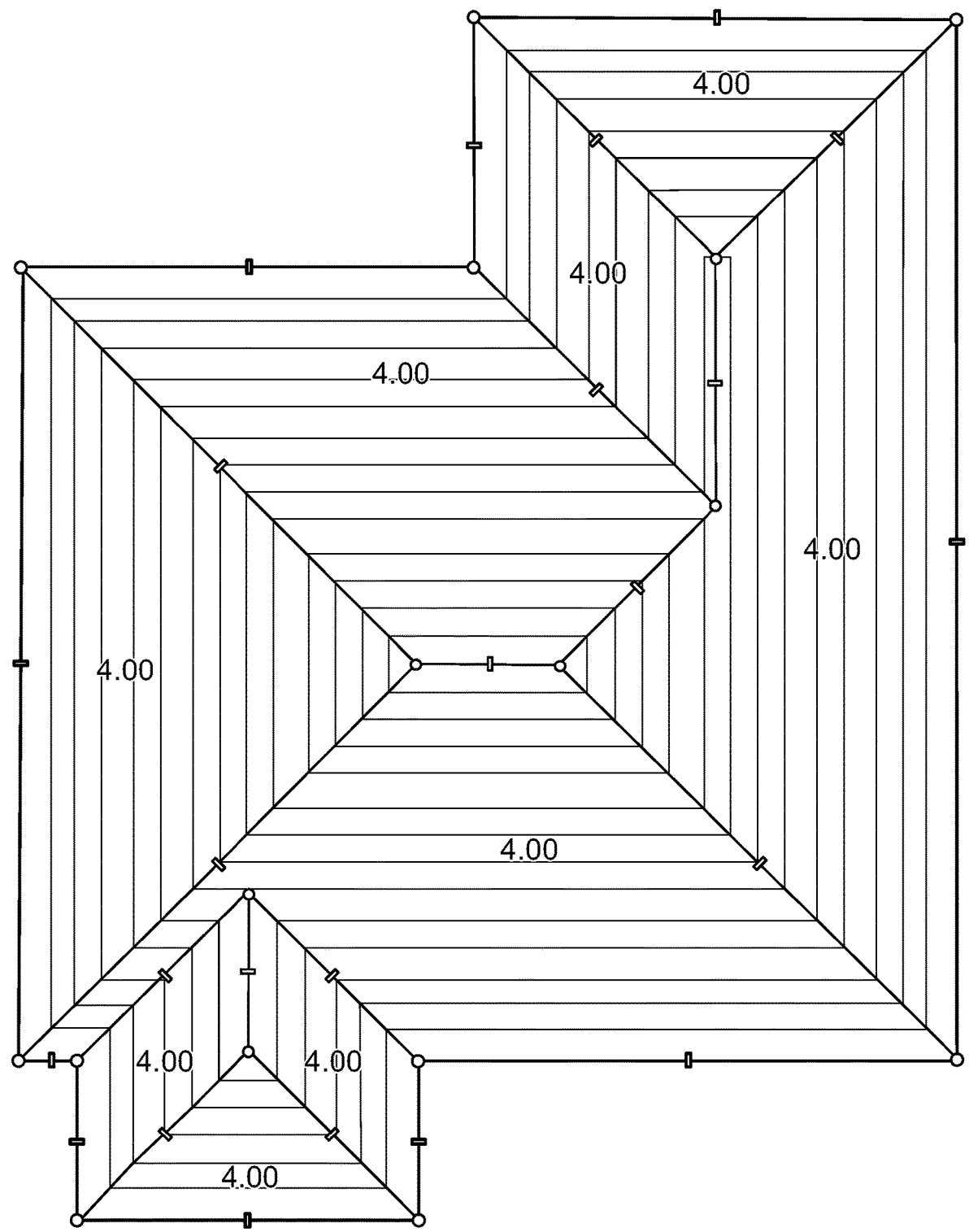
FIG. 21 is a diagram illustrating the straight skeleton algorithm implemented by the system using a sweeping plane simulation.

The straight skeleton reconstruction can be performed via a straight skeleton algorithm. The straight skeleton algorithm is a method of creating a topological representation of a given polygon. A straight skeleton of a polygon is generated by shrinking an exterior contour along angular bisectors at vertices by using plane intersections. A directional plane originates from each edge of the input polygon. The shrinking is simulated with a flat sweeping plane that moves upwards in a Z direction, intersecting with each directional plane. By progressively moving a sweeping plane upwards and intersecting directional planes originating from each polygon edge, a straight-line interior structure of the input polygon can be inferred. Final roof faces can be reconstructed from the interior line segments generated by the sweeping plane simulation. FIG. 21 is an illustration of the straight skeleton algorithm using sweeping plane simulation. As seen in FIG. 21, the polygon shrinks as the sweeping plane moves up intersecting the directional planes from each polygon edge.

Each input edge can contain a weight that determines the slope of its directional plane. For example, the weight can be any value between −1.0 and 1.0. A negative weight indicates the directional plane slopes outward, away from a contour. A weight of 0.0 indicates the directional plane is vertical, creating a rake segment. A positive weight indicates the directional plane is pointing inwards toward the center of the contour. The weighted approach discussed in the embodiment above is known as Mixed Weight Straight Skeleton (MWSS) and enables interior line segments to be properly determined. However, those skilled in the art would understand that other approaches may be used to determine interior line segments.

Multiple planes can meet in intersections. This may be referred to as "events". A first example type of an event is a general intersection event. The general intersection event is an event caused by three or more directional planes intersecting. Depending on which edges participate in the event, the event is handled differently. Chains of edges are created and processing using the intra-chain resolution followed by the inter-chain resolution. General intersection events result in interior line segments being added.

Figures 22A, 22B:
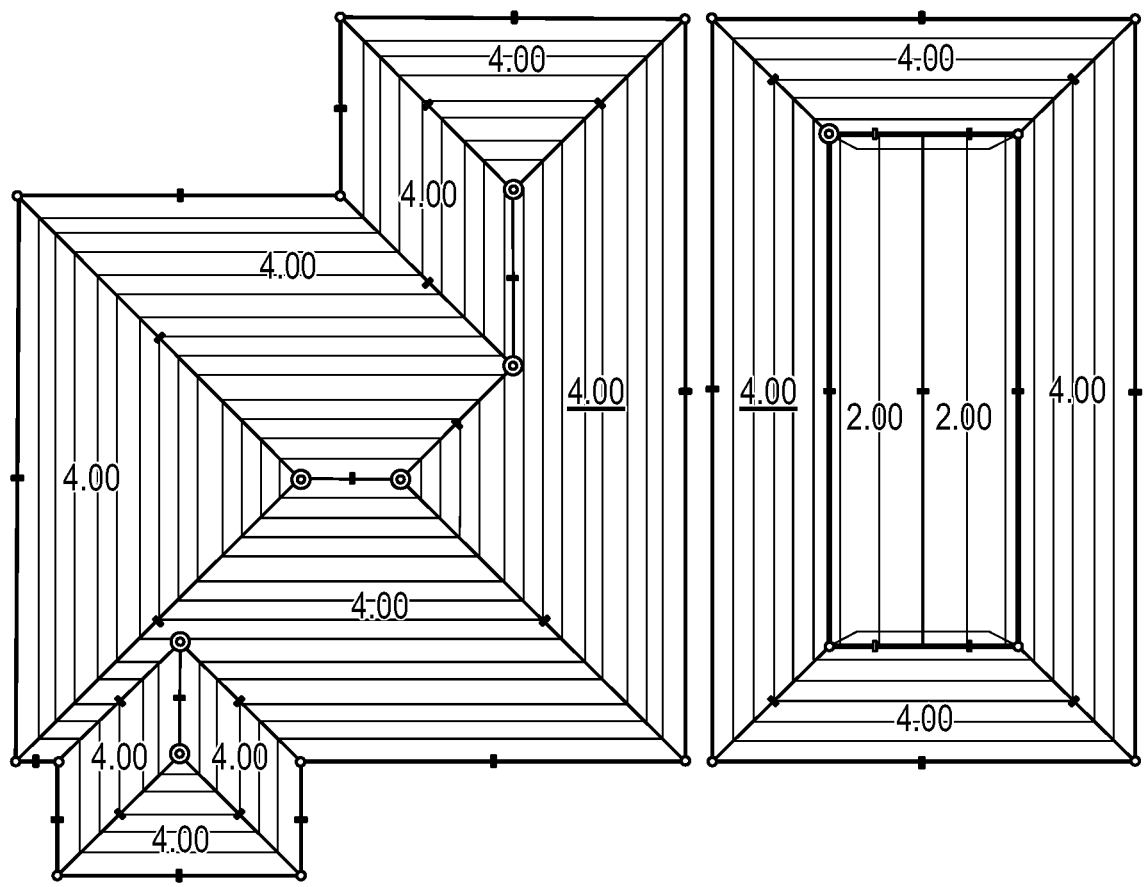
FIG. 22A is a diagram illustrating a general intersection event.
FIG. 22B is a diagram illustrating a user-generated event.

A second example of an event is a user events. The user event modifies behavior of a simulation while it is running. The user event can occur at a given 3D location and modify the behavior of the simulation starting at the 3D location. The user event can change the directional plane of an input edge, or insert a new shape into an existing contour. These events are used to generate a wide variety of roof types and configurations. FIG. 22A is an illustration showing a general intersection event. FIG. 22B is an illustration showing a user event. The user event in FIG. 22B changes the directional planes of all of the edges once a given elevation has been reached during a simulation.

In an embodiment, the straight skeleton algorithm can start by computing general intersection events for each set of 3 adjacent planes and adding the intersection events to a priority queue sorted by a lowest Z. User events are specified at initialization and added to the queue. While there are events in the queue, the straight skeleton algorithm takes the top event from the queue and processes it. When all the events are processed, the roof faces are recovered by traversing the edges that participated in the straight skeleton algorithm.

Using the straight skeleton algorithm, the system can produce multiple complete candidate roofs which are consistent with the extracted line graph. Each roof candidate may then be projected back into pixel space of the multiple views and compared with the neural network outputs to determine how well the 3D reconstructed output matches the neural network outputs. This can be used to generate a confidence score for each 3D reconstruction candidate and select the highest scoring reconstruction as a final candidate roof. The system can also use additional data, such as point clouds or additional neural networks in calculating the confidence score. The output of the system can be a single candidate roof reconstruction along with its confidence score.

Figure 23:
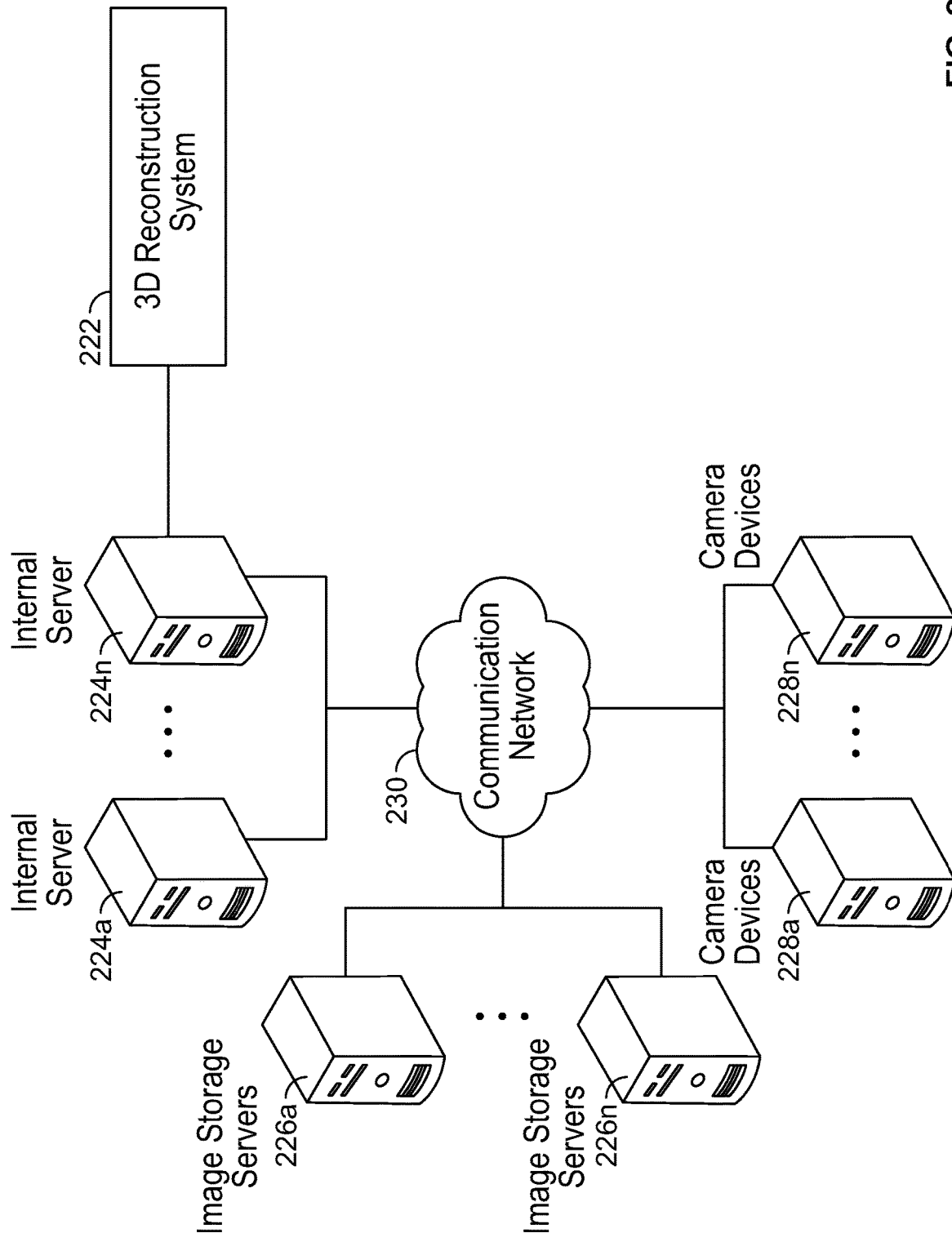
FIG. 23 is a diagram illustrating sample hardware components on which the system of the present disclosure could be implemented.

FIG. 23 is a diagram illustrating computer hardware and network components on which the system of the present disclosure could be implemented. The system can include a plurality of internal servers 224a-224n having at least one processor and memory for executing the computer instructions and methods described above (which could be embodied as computer software 222 illustrated in the diagram). The system can also include a plurality of image storage servers 226a-226n for receiving the image data and video data. The system can also include a plurality of camera devices 228a-228n for capturing image data and video data. These systems can communicate over a communication network 230. The 3D reconstruction system 222 or engine can be stored on the internal servers 224a-224n or on an external server(s). Of course, the system of the present disclosure need not be implemented on multiple devices, and indeed, the system could be implemented on a single computer system (e.g., a personal computer, server, mobile computer, smart phone, etc.) without departing from the spirit or scope of the present disclosure.

Having thus described the system and method in detail, it is to be understood that the foregoing description is not intended to limit the spirit or scope thereof. It will be understood that the embodiments of the present disclosure described herein are merely exemplary and that a person skilled in the art can make any variations and modification without departing from the spirit and scope of the disclosure. All such variations and modifications, including those discussed above, are intended to be included within the scope of the disclosure. What is desired to be protected by Letters Patent is set forth in the appended claims.

What is claimed is:

1. A system for modeling a roof of a structure, comprising:
a first database;
a second database; and
a processor in communication with the first database and the second database, the processor:
selecting at least one image and metadata of the image from the first database based on a geospatial region of interest;
generating two-dimensional outputs in pixel space of at least one roof structure present in the selected at least one image;
generating two-dimensional line segment geometries in the pixel space based on the generated two-dimensional outputs;
classifying the generated two-dimensional line segment geometries into at least one contour graph based on three-dimensional data received from the second database;

generating a three-dimensional representation of the at least one roof structure based on the at least one contour graph and the received three-dimensional data;

transforming the classified two-dimensional line segment geometries into three-dimensional line segment geometries in world space based on the at least one contour graph;

applying at least one constraint to the three-dimensional line segment geometries, the at least one constraint being indicative of a rectification of at least one of parallel, perpendicular and collinear three-dimensional line segment geometries;

generating a plurality of exterior contours based on the rectified three-dimensional line segment geometries, each exterior contour corresponding to a different elevation of the at least one roof structure;

determining interior line segments of each exterior contour via a straight skeleton algorithm; and generating the three-dimensional representation of the at least one roof structure based on the determined interior line segments.

2. The system of claim 1, wherein the geospatial region of interest comprises one of latitudinal and longitudinal coordinates of a region, a shape bounding a postal address and a user defined region input via a geospatial mapping interface.

3. The system of claim 1, wherein the metadata comprises data of a camera utilized to capture the at least one image, the data including intrinsic parameters of the camera and extrinsic parameters of the camera.

4. The system of claim 1, wherein the at least one image is an aerial image, a satellite image, a ground based image, or a photograph.

5. The system of claim 1, wherein a neural network generates the two-dimensional outputs, the two-dimensional outputs being indicative of features of the at least one roof structure present in the selected at least one image.

6. The system of claim 5, wherein the features of the at least one roof structure comprise one or more of:
a line type indicative of an eave, a rake, a hip, a valley, a flat valley, and a ridge,
a line direction indicative of an orientation of each line type,
a gradient indicative of a slope of the at least one roof structure,
a face type indicative of at least one of an extension of, a protrusion from, and a wall of the at least one roof structure, and
a corner indicative of an intersection between two line types.

7. The system of claim 1, wherein a neural network generates the two-dimensional outputs and the processor generates the two-dimensional line segment geometries in the pixel space based on the generated two-dimensional outputs and an orientation of a structure corresponding to the at least one roof structure.

8. The system of claim 1, wherein the three-dimensional data is one of light detection and ranging data, point cloud data and feature triangulation data.

9. The system of claim 1, wherein the processor:
generates a plurality of candidate three-dimensional representations of the at least one roof structure,
transforms the plurality of candidate three-dimensional representations into pixel space,
determines a confidence score for each of the transformed candidate three-dimensional representations based on a correlation with the generated two-dimensional outputs in pixel space of the at least one roof structure, and
determines the three-dimensional representation of the at least one roof structure among the plurality of transformed candidate three-dimensional representations based on the confidence score.

10. A method for modeling a roof of a structure, comprising:
receiving a geospatial region of interest;
selecting at least one image and metadata of the image from a first database based on the received geospatial region of interest;
generating two-dimensional outputs in pixel space of at least one roof structure present in the selected at least one image;
generating two-dimensional line segment geometries in the pixel space based on the generated two-dimensional outputs;
classifying the generated two-dimensional line segment geometries into at least one contour graph based on three-dimensional data received from a second database;
generating a three-dimensional representation of the at least one roof structure based on the at least one contour graph and the received three-dimensional data;
transforming the classified two-dimensional line segment geometries into three-dimensional line segment geometries in world space based on the at least one contour graph;
applying at least one constraint to the three-dimensional line segment geometries, the at least one constraint being indicative of a rectification of at least one of parallel, perpendicular and collinear three-dimensional line segment geometries;
generating a plurality of exterior contours based on the rectified three-dimensional line segment geometries, each exterior contour corresponding to a different elevation of the at least one roof structure;
determining interior line segments of each exterior contour via a straight skeleton algorithm; and
generating the three-dimensional representation of the at least one roof structure based on the determined interior line segments.

11. The method of claim 10, further comprising generating, by a neural network, the two-dimensional outputs, the two-dimensional outputs being indicative of features of the at least one roof structure present in the selected at least one image.

12. The method of claim 10, further comprising:
generating, by a neural network, the two-dimensional outputs, and
generating the two-dimensional line segment geometries in the pixel space based on the generated two-dimensional outputs and an orientation of a structure corresponding to the at least one roof structure.

13. The method of claim 10, further comprising:
generating a plurality of candidate three-dimensional representations of the at least one roof structure,
transforming the plurality of candidate three-dimensional representations into pixel space,
determining a confidence score for each of the transformed candidate three-dimensional representations based on a correlation with the generated two-dimensional outputs in pixel space of the at least one roof structure, and
determining the three-dimensional representation of the at least one roof structure among the plurality of transformed candidate three-dimensional representations based on the confidence score.

14. A non-transitory computer readable medium having instructions stored thereon for modeling a roof of a structure which, when executed by a processor, causes the processor to carry out the steps of:
- selecting at least one image and metadata of the image from a first database based on a received geospatial region of interest;
- generating two-dimensional outputs in pixel space of at least one roof structure present in the selected at least one image;
- generating two-dimensional line segment geometries in the pixel space based on the generated two-dimensional outputs;
- classifying the generated two-dimensional line segment geometries into at least one contour graph based on three-dimensional data received from a second database;
- generating a three-dimensional representation of the at least one roof structure based on the at least one contour graph and the received three-dimensional data;
- transforming the classified two-dimensional line segment geometries into three-dimensional line segment geometries in world space based on the at least one contour graph;
- applying at least one constraint to the three-dimensional line segment geometries, the at least one constraint being indicative of a rectification of at least one of parallel, perpendicular and collinear three-dimensional line segment geometries;
- generating a plurality of exterior contours based on the rectified three-dimensional line segment geometries, each exterior contour corresponding to a different elevation of the at least one roof structure;
- determining interior line segments of each exterior contour via a straight skeleton algorithm; and
- generating the three-dimensional representation of the at least one roof structure based on the determined interior line segments.

15. The non-transitory computer-readable medium of claim 14, the processor further carrying out the steps of generating, by a neural network, the two-dimensional outputs, the two-dimensional outputs being indicative of features of the at least one roof structure present in the selected at least one image.

16. The non-transitory computer-readable medium of claim 14, the processor further carrying out the steps of:
- generating, by a neural network, the two-dimensional outputs, and
- generating the two-dimensional line segment geometries in the pixel space based on the generated two-dimensional outputs and an orientation of a structure corresponding to the at least one roof structure.

17. The non-transitory computer-readable medium of claim 14, the processor further carrying out the steps of:
- generating a plurality of candidate three-dimensional representations of the at least one roof structure,
- transforming the plurality of candidate three-dimensional representations into pixel space,
- determining a confidence score for each of the transformed candidate three-dimensional representations based on a correlation with the generated two-dimensional outputs in pixel space of the at least one roof structure, and
- determining the three-dimensional representation of the at least one roof structure among the plurality of transformed candidate three-dimensional representations based on the confidence score.

* * * * *